(12) United States Patent
Wick et al.

(10) Patent No.: US 11,017,151 B2
(45) Date of Patent: *May 25, 2021

(54) SYSTEMS AND METHODS FOR SCALABLE HIERARCHICAL COREFERENCE

(71) Applicant: Oracle International Corporation, Redwood City, CA (US)

(72) Inventors: Michael Louis Wick, Burlington, MA (US); Jean-Baptiste Frederic George Tristan, Burlington, MA (US); Stephen Joseph Green, Burlington, MA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/833,276

(22) Filed: Mar. 27, 2020

(65) Prior Publication Data

US 2020/0226318 A1 Jul. 16, 2020

Related U.S. Application Data

(63) Continuation of application No. 16/379,645, filed on Apr. 9, 2019, now Pat. No. 10,606,931.

(60) Provisional application No. 62/673,061, filed on May 17, 2018.

(51) Int. Cl.
| | |
|---|---|
| *H03M 7/00* | (2006.01) |
| *G06F 40/137* | (2020.01) |
| *G06N 7/00* | (2006.01) |
| *H03M 7/30* | (2006.01) |
| *G06N 5/04* | (2006.01) |
| *G06F 17/16* | (2006.01) |
| *G06F 40/146* | (2020.01) |

(52) U.S. Cl.
CPC ............ *G06F 40/137* (2020.01); *G06F 17/16* (2013.01); *G06F 40/146* (2020.01); *G06N 5/04* (2013.01); *G06N 7/005* (2013.01); *H03M 7/3082* (2013.01)

(58) Field of Classification Search
CPC ....... G06F 40/137; G06F 40/146; G06N 5/04; G06N 7/005
USPC .............................................. 341/50, 51, 79
See application file for complete search history.

(56) References Cited

U.S. PATENT DOCUMENTS

| | | |
|---|---|---|
| 9,767,183 B2 | 9/2017 | Su et al. |
| 2016/0204799 A1 | 7/2016 | Ackerman et al. |
| 2018/0060915 A1 | 3/2018 | Liu et al. |

(Continued)

OTHER PUBLICATIONS

Andrei Z. Broder et al ("On the resemblance and containment of documents"), pp. 1-9.; Jun. 13, 1997.

(Continued)

*Primary Examiner* — Peguy Jean Pierre
(74) *Attorney, Agent, or Firm* — Robert C. Kowert; Kowert, Hood, Munyon, Rankin & Goetzel, P.C.

(57) ABSTRACT

A scalable hierarchical coreference method that employs a homomorphic compression scheme that supports addition and partial subtraction to more efficiently represent the data and the evolving intermediate results of probabilistic inference. The method may encode the features underlying conditional random field models of coreference resolution so that cosine similarities can be efficiently computed. The method may be applied to compressing features and intermediate inference results for conditional random fields. The method may allow compressed representations to be added and subtracted in a way that preserves the cosine similarities.

20 Claims, 13 Drawing Sheets

(56) References Cited

U.S. PATENT DOCUMENTS

2018/0300429 A1    10/2018   Barouni Ebrahimi et al.

OTHER PUBLICATIONS

Moses S. Charikar et al, ("Similarity Estimation Techniques from Rounding Algorithms"), Dated May 19-21, 2002, pp. 1-9.
Devdatt P. Dubhashi et al, ("Concentration of Measure for the Analysis of Randomised Algorithms"), dated Sep. 7, 2006, pp. 1-207.
Lise Getoor et al, ("Entity Resolution: Tutorial"), http://www.cs.umd.edu/'getoor/Tutorials/ER_Asonam2012.pdf, pp. 1-209.
N. Halko et al, ("Finding Structure with randomness: Probabilistic Algorithms for Constructing Approximate matrix Decompositions"), Dated Dec. 14, 2010, pp. 1-74.
Monika Henzinger, (Finding Near-Duplicate Web Pages: A Large-Scale Evaluation of Algorithms), dated Aug. 6-11, 2006, pp. 1-8.
Jure Leskovec et al, ("Finding Similar Items Locality Sensitive Hashing"), http:www.mmds.org, pp. 1-59.; 2020.
Gurmeet Singh Manku et al, ("Detecting Near-Duplicates for Web Crawling"), 2007, pp. 1-9.
Andrew McCallum et al, ("Factories Efficient Probabilistic Programming for Relational Factor Graphs via Imperative Declarations of Structure, Inference and Learning"), pp. 1-3.; 2009.
Andrew McCallum et al, (" Factorie: Probabilistic Programming via Imperatively Defined Factor Graphs"), pp. 1-9. 2009.
Tomas Mikolov et al, ("Distributed Representations of Words and Phrases and their Compositionality"), pp. 1-9. 2018.
Ali Rahimi et al, ("Random Features for Large-Scale Kernel Machines"), pp. 1-8.
Kilian Weinberger et al, ("Feature Hashing for Large Scale Multitask Learning"), dated Feb. 27, 2010, pp. 1-10.
Michael Wick et al, ("A Discriminative Hierarchical Model for Fast Coreference at Large Scale"), proceesings of the 50th Annual Meting of the Association for computational Linguistics, dated Jul. 8-14, 2012, pp. 379-388.
Michael Louis Wick, ("Epistemological Databases for Probabilistic Knowledge Base Construction"), 2015, pp. 1-192.

SYSTEMS AND METHODS FOR SCALABLE HIERARCHICAL COREFERENCE

PRIORITY INFORMATION

This application is a continuation of U.S. patent application Ser. No. 16/379,645, filed Apr. 9, 2019, which claims benefit of priority of U.S. Provisional Application Ser. No. 62/673,061, filed May 17, 2018, the content of which are incorporated by reference herein in their entirety.

BACKGROUND

Field of the Disclosure

This disclosure relates generally to locality-sensitive hashing (LSH) algorithms, and more specifically to a method for scalable hierarchical coreference in data systems.

Description of the Related Art

Probabilistic models in machine learning such as conditional random fields (CRFs) and factor graphs are widely successful at modeling many problems in natural language processing (NLP). However, the underlying feature representations are often sparse, high-dimensional and dynamic (change during inference). For example, consider the task of coreference resolution in which the goal is to partition a set of mentions into the entities to which they refer. Each mention may be represented with a feature vector in which each dimension corresponds to a word, n-gram or character n-gram. Since only a small subset of the vocabulary is observed per mention, most elements of the vector are zero.

Given the model and these representations, inference entails making decisions about whether two entities should be coreferent. To make such decisions, the model should compute the probability that the two entities are coreferent (i.e., the same) which involves computing the similarities between the aggregate feature representations of their mentions. Since the feature vectors are both sparse and high-dimensional, these similarity operations can be computationally expensive. Moreover, as the inference algorithm makes decisions about whether or not two entities are coreferent, the entities may have to be split or merged and thus the feature vector representations should be updated to reflect these changes. Maintaining such sparse-vector representations in the inner-loop of probabilistic inference is expensive, especially as the entities grow in size.

When applying probabilistic graphical models such as conditional random fields or factor graphs to natural language processing, a system should be able to handle sparse, high dimensional and dynamically changing feature vectors in an efficient manner. Most probabilistic graphical model frameworks employ sparse vector representations, which maintain a list of the indices for the non-zero elements of the vector and their corresponding values, for this purpose. Addition and subtraction in such representations are inefficient because it involves dynamically adjusting the lengths of the non-zero lists to reflect the result. These operations are especially costly since they often appear in the inner-loops of learning and inference. As a specific example, the hierarchical coreference model in some implementations (e.g., the FACTORIE toolkit) becomes increasingly slow during inference because maintaining the sparse vectors is expensive, and becomes increasingly expensive as the number of non-zero elements grows during inference.

SUMMARY

Embodiments of systems and methods for scalable hierarchical coreference in data systems are described. Coreference resolution, or entity disambiguation, is the problem of partitioning a set of mentions into the entities to which they refer. This problem is pervasive throughout some data systems. For example, a data system that stores data in a data cloud may have the problem of deduplicating addresses and names of people living in the United States. As an example, entities that deal with social media may extract mentions of people, products, and companies, for example from Tweets and text, and may wish to link this data to a knowledge base with coreference.

Embodiments may provide an extension of the cosine preserving SimHash hashing scheme that makes it a group-homomorphic hash. Such a hash allows embodiments to represent potentially very large, sparse, and high-dimensional sets of features in coreference as low-dimensional fixed-width vectors. In order to run an algorithm such as a conditional random field hierarchical coreference algorithm, the hashing scheme is designed to compute union and difference of sets of features directly on the hashes. The hashing scheme allows scaling the hierarchical coreference algorithm by an order of magnitude without degrading its statistical performance or sacrificing quality.

Embodiments may provide a modified version of SimHash, a locality-sensitive hashing (LSH) scheme, to represent the features and the intermediate results of inference in the graphical model. Furthermore, embodiments of the LSH method described herein may address the problem that the representations change during inference, and may allow for the addition and partial subtraction of SimHash vectors while still preserving the algorithm's ability to estimate the cosine similarity. Embodiments may employ this modified SimHash scheme for a probabilistic model of hierarchical coreference, and thus obtain an order of magnitude speed-up over the default implementation.

Prior solutions employ exact sparse-vector representations. Embodiments of the hashing scheme may map the high-dimensional space to a much lower-dimensional dense space for which fast array-based operations may be employed for the vectors. It is not obvious that such an approach would work since the mapping to the dense space introduces approximation error that could affect the behavior of the model. However, it can be shown empirically that it works well in practice, while preserving the variance bounds of the original algorithm.

Figure 1:
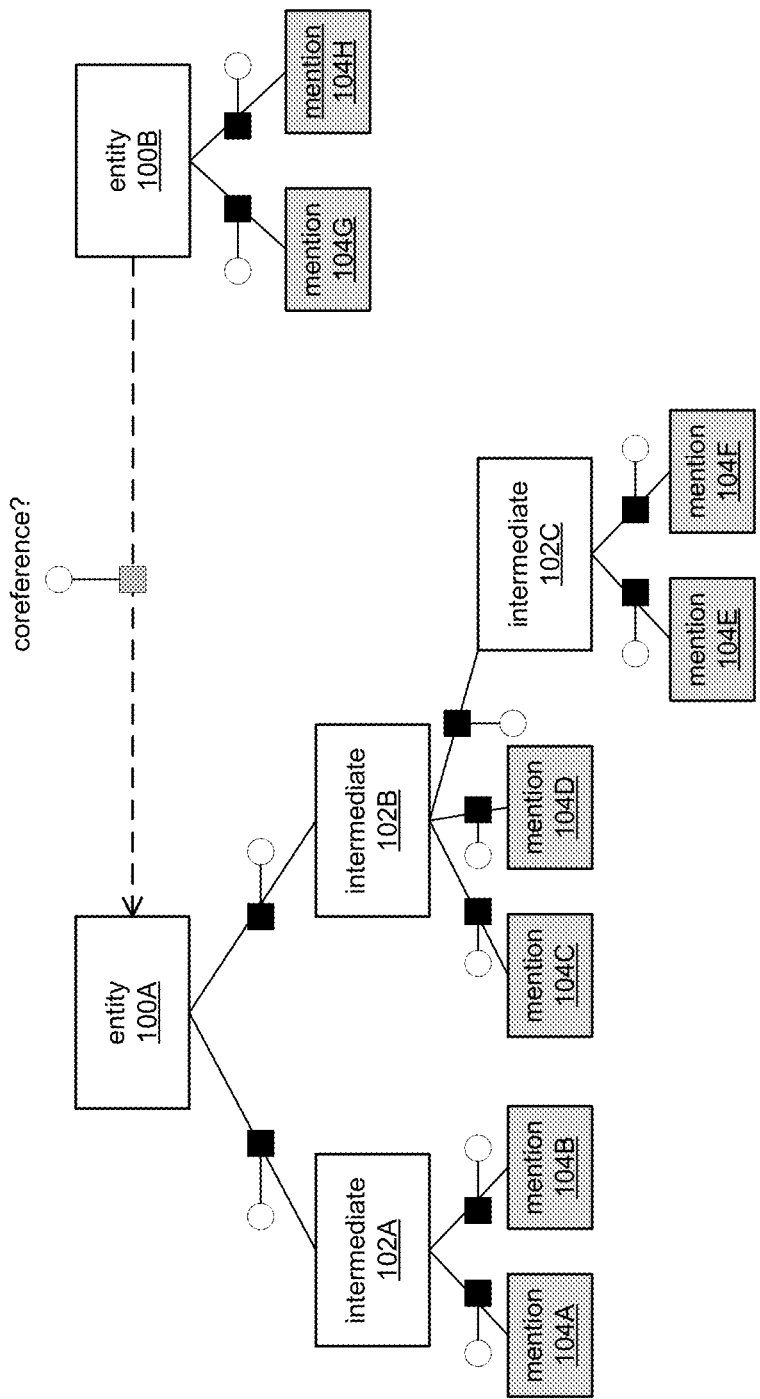
FIG. 1 graphically illustrates a hierarchical conditional random field model, according to some embodiments.

While the disclosure is described herein by way of example for several embodiments and illustrative drawings, those skilled in the art will recognize that the disclosure is not limited to embodiments or drawings described. It should be understood that the drawings and detailed description hereto are not intended to limit the disclosure to the particular form disclosed, but on the contrary, the disclosure is to cover all modifications, equivalents and alternatives falling within the spirit and scope as defined by the appended claims. Any headings used herein are for organizational purposes only and are not meant to limit the scope of the description or the claims. As used herein, the word "may" is used in a permissive sense (i.e., meaning having the potential to) rather than the mandatory sense (i.e. meaning must). Similarly, the words "include", "including", and "includes" mean including, but not limited to.

DETAILED DESCRIPTION OF EMBODIMENTS

Embodiments of systems and methods for scalable hierarchical coreference in data systems are described. A data system may collect and store information for many different entities across the world in a data cloud. For example, data may be collected for purchases made by many different entities using credit or debit cards. This information may be collected from many different sources: stores, businesses, on-line purchases, etc. A challenge with data clouds is that, with the data from many different entities using many different cards coming from many difference sources, there is a need to identify which particular entity each transaction belongs to. Many entities may have two or more different credit/debit cards, and the data system needs to associate different transactions made with different cards with particular entities. For example, a particular person may have two credit cards for two different retailers; when the two cards are used to make purchases at different locations, the data system needs to determine if the two users of the cards are actually the same person. This problem is referred to as entity disambiguation, or coreference resolution. Other examples of applications in which coreference resolution may be necessary include, but are not limited to:

Applications that extract mentions of people, products, and companies from social media, for example from Tweets and text, and wish to link this data to a knowledge base with coreference.

Applications that need to disambiguate inventors and assignees across millions of patents and patent applications.

Applications that need to disambiguate authors of scientific articles.

Applications that need to merge two large data sets, for example two customer databases.

A solution to the coreference resolution problem is to use the hierarchical coreference algorithm. However, hierarchical coreference does not scale well for large data sets. Thus, conventional hierarchical coreference algorithms may not perform fast enough for data systems with large data clouds. Embodiments of the scalable hierarchical coreference methods and systems described herein are significantly faster than conventional hierarchical coreference algorithm implementations, and thus are well-suited for performing coreference resolution in large data sets.

To cope with the computational problems associated with sparse, high-dimensional dynamic feature representations, embodiments may implement a homomorphic compression scheme based on locality-sensitive hashing (LSH) that also supports addition and partial subtraction to more efficiently represent the data and the evolving intermediate results of probabilistic inference.

Embodiments may apply LSH to compress features and intermediate inference results for conditional random fields. Embodiments may apply SimHash to represent the static features that do not change during inference. These representations enable efficient cosine similarity computations for conditional random field models of coreference resolution. Embodiments may provide a modification to SimHash to support dynamic features that change during inference. In particular, the algorithm enables the efficient addition and partial subtraction of the compressed feature vectors in such a way that preserves the original cosine similarity estimates of the sparse high-dimensional space.

Embodiments may improve the speed of probabilistic inference on a hierarchical model for coreference resolution (also referred to as a hierarchical coreference model or algorithm) by an order of magnitude while having little or no effect on the quality of the model. An example hierarchical coreference model is described in Wick, Michael, Sameer Singh, and Andrew McCallum, "A discriminative hierarchical model for fast coreference at large scale," *Proceedings of the 50th Annual Meeting of the Association for Computational Linguistics: Long Papers-Volume* 1, Association for Computational linguistics, 2012, which is hereby incorporated by reference in its entirety.

SimHash and its Statistical Properties

A locality-sensitive hash (LSH) for a distance metric don a set of objects S is a function H such that given x, y∈S, d(x, y) can be estimated from the hashed representations H(x) and H(y); SimHash is an LSH for cosine similarity. In this section, SimHash is described, and some of its statistical properties are discussed.

SimHash

SimHash is a type of locality-sensitive hashing (LSH) algorithm, other examples of which include the min-hash algorithm. These algorithms are often applied in streaming or large-scale settings and might be used, for example, to detect duplicate webpages for web-crawlers. LSH is sometimes employed in search and machine-learning applications including coreference where it is used as a "blocking" technique to reduce the search space. Note that this application of LSH for coreference is orthogonal and complementary to the application of LSH as described herein for embodiments.

Other dimensionality reduction methods such as random projections are more common in machine learning.

Examples of use-cases include feature-hashing, fast matrix decomposition and fast kernel computations, among others.

Note that word embeddings could be employed to reduce the dimensionality of the features. However, in practice, these embeddings may be too smooth to be useful for detecting the similarity between the names of people, places or organizations, as is necessary in coreference. However, embeddings may be used as additional context information in some embodiments.

To understand SimHash, it is helpful to consider the following randomized process. Imagine two vectors a and b on the unit hypersphere in the Euclidean space $R^d$ with angle $\theta$ between them, with the need to produce an estimate of $\cos(\theta)$. Select a unit vector u uniformly at random and let the random variable X have value 1 if a and b are on different sides of the hyperplane orthogonal to u, and 0 otherwise. Then X is a Bernoulli random variable with expected value:

$$E[X] = 1 - \frac{\theta}{\pi} E[X] = \mathbb{P}(\text{sign}(a \cdot u) \neq \text{sign}(b \cdot u)) \quad (1)$$

$$= 1 - \mathbb{P}(\text{sign}(a \cdot u) = \text{sign}(b \cdot u)) \quad (2)$$

$$= 1 - \frac{\theta}{\pi} \quad (3)$$

Let $X_1 \ldots X_n$ be the result of independently repeating this process several times, and set $$\overline{X}_n = \frac{1}{n} \sum_{i=1}^{n} X_i.$$

Then $$E[\overline{X}_n] = 1 - \frac{\theta}{\pi},$$

and hence $E[\pi(1-\overline{X}_n)]=0$, so that $\cos(\pi(1-\overline{X}_n))$ can be used as an estimator of $\cos(\theta)$. Note that, for some applications, $$1 - \frac{\theta}{\pi}$$

may be a good enough approximation of $\cos(\theta)$, so that $\overline{X}_n$ can be used directly as an estimator of $\cos(\theta)$.

The idea behind SimHash is to come up with a hash representation which reproduces this randomized estimator: to construct a function H which produces n-bit hashes, first select n unit vectors $u_1, \ldots, u_n$ uniformly at random. Then, given a vector a, the hash h(a) is the length n bit sequence in which the ith bit is 1 if the sign of $a \cdot u_i$ is positive and 0 otherwise. Now, from two hashed representations h(a) and h(b), if the ith bit in the two hashes disagree, this is equivalent to $X_i$ in the randomized process above being equal to 1. Thus, counting the number of positions where the hashes are distinct and dividing by n yields $\overline{X}_n$, and can thereby produce an estimate of $\cos(\theta)$.

Statistical Properties

Let $g(x)=\cos(\pi(1-x))$. Since $E[\pi(1-\overline{X}_n)]=0$, a plausible estimator for $\cos(\theta)$ is to use $g(\overline{X}_n)$. Let $C_n=g(\overline{X}_n)$ be this estimator. Some additional statistical properties of this estimator are now described. Locality-sensitive hashing algorithms such as SimHash are most commonly used for duplicate detection and for approximate nearest neighbor search, which are significantly different from the use cases described herein. In those settings, the desire is to show that if two items x and y are very similar, then the distance estimated from h(x) and h(y) will very likely be quite small, and conversely if x and y are very different, then their estimated distances will be large. However, as described later in this document, embodiments use the cosine distance estimates as part of the scoring function of a Markov chain Monte Carlo (MCMC) algorithm. Hence, there is an interest in additional statistical properties of the estimator.

Lemma A.1. $C_n$ is consistent. In particular, $$C_n \xrightarrow{a.s.} \cos(\theta).$$

Proof: By the strong law of large numbers:

$$\overline{X}_n \xrightarrow{a.s.} 1 - \frac{\theta}{\pi}.$$

Since g is continuous, by the continuous mapping theorem, $$g(\overline{X}_n) \xrightarrow{a.s.} g\left(1 - \frac{\theta}{\pi}\right) = \cos(\theta).$$

Lemma A.2.

$$E[C_n] = \cos(\theta) + E_n, \text{ where } |E_n| \leq \frac{\pi^2}{8n}.$$

Proof: Set $$\mu = E[\overline{X}_n] = 1 - \frac{\theta}{\pi}.$$

The first degree Taylor series for g(x) about μ is:

$$g(x) = \cos(\theta) + \pi \sin(\theta)(x-\mu) + R(x)$$

where R is the remainder term. Therefore:

$$E[g(\overline{X}_n)] = \cos(\theta) + \pi \sin(\theta)(E[\overline{X}_n] - \mu) + E[R(\overline{X}_n)] \quad (4)$$

$$= \cos(\theta) + E[R(\overline{X}_n)] \quad (5)$$

Thus it suffices to bound $$|E[R(\overline{X}_n)]|,$$

which can be done using Lagrange's remainder formula.

Lemma A.3.

$$V[C_n] = \frac{\pi^2 \sin^2(\theta)}{n} \cdot \frac{\theta}{\pi}\left(1 - \frac{\theta}{\pi}\right) + O(n^{-3/2}).$$

Proof. For intuition, note that the Taylor series above for g shows that $$g(x) \approx \cos(\theta) + \pi \sin(\theta)(x-\mu).$$

So, recalling that $$V[C_n]=V[g(\overline{X}_n)]=E[g(\overline{X}_n)^2]-E[g(\overline{X}_n)]^2,$$

and plugging in the approximation:

$$V[g(X_n)] \approx E\left[(\cos(\theta) + \pi \sin(\theta)(X_n - \mu))^2\right] - \cos(\theta)^2 \quad (6)$$

$$= 2\pi \sin(\theta)E[X_n - \mu] + \pi^2\sin^2(\theta)E\left[(X_n - \mu)^2\right] \quad (7)$$

$$= \pi^2\sin^2(\theta)E\left[(X_n - \mu)^2\right] \quad (8)$$

To obtain the actual error bound, the same process is carried out but without dropping R(x) from the Taylor approximation for g, and then once again using Lagrange's remainder formula to bound the remainder.

These results can be used with Chebyshev's inequality to obtain bounds on the probability that G will deviate from cos(θ). Observe that when the true angle θ is very small or very close to π, the variance will be small, giving tighter bounds. For example, if θ=n/8 and n=128, then (neglecting the error term in the variance), $$P(|C_n-E[C_n]| \geq 0.1) \leq 0.124, \text{ and}$$

$$E[C_n]-\cos(\theta)|<10^{-4}, \text{ so that}$$

$$P(|_n-\cos(\theta)| \geq 0.1+10^{-4}) \leq 0.124.$$

Fast SimHash with Feature Hash Functions

Rather than constructing the hash function H by sampling the $u_1, \ldots, u_n$ vectors from the d-dimensional unit sphere uniformly at random, an optimization is to instead sample them from $\{-1, 1\}^d$. This has two advantages. First, it is faster to compute the dot product since no floating point multiplication is involved. Second, rather than having to explicitly sample and store each $u_i$ as a vector, each $u_i$ can be replaced by a 1-bit feature hash function $h_i$: the "value" of the vector represented by $h_i$ is 1 at coordinate j if $h_i(j)=1$ and is −1 if $h_i(j)=0$. $a \cdot h_i$ is written for the dot product of a with the vector corresponding to $h_i$.

By restricting only to test vectors with coordinates of the form 1 and −1, the corresponding expected value of $\pi(1-\overline{X}_n)$ is no longer exactly θ. However, for high-dimensional spaces, this approximation is effective.

Scaling Coreference Resolution

Coreference

Coreference resolution is the problem of determining whether different mentions refer to the same underlying entity. For example, in the sentence "In a few years [Jones] would replace [Brown] as the forty-two year old [quarterback], [Smith] retires," coreference should correctly determine that "quarterback" refers to Smith and not Jones or Brown. Coreference resolution arises in many other situations; for example, when merging two or more databases it is desirable to remove duplicates that result from the merge, a problem sometimes termed record linkage or deduplication. Coreference is also foundational to knowledge base construction which requires the combination of information about entities of interest from multiple sources that might mention them in different contexts. For example, to build a knowledge base of all scientists in the world based at least in part on citations for scientific papers, author coreference may need to be performed to determine who authored what papers. For example, is the "J Smith" listed as an author in this citation:

V Khachatryan, A M Sirunyan, . . . , J Smith. *Observation of the diphoton decay of the Higgs boson and measurement of its properties. The European Physical Journal* 2014.

the same "J Smith" listed as an author in this citation:

S Chatrchyan, V Khachatryan, A M Sirunyan, A Tumasyan, W Adam, J Smith. *Jet production rates in association with W and Z bosons in pp collisions. J High Energy Physics* 2012.

Although generally this is a difficult problem, it can be solved with machine learning since features of the mentions such as the words in the title (both have "Boson" in common), the topic of the title (both are about a similar subfield of physics), the journal (both are physics journals) and the co-authors (there appears to be at least one co-author in common) provide some evidence about whether or not the two references to the "J Smith" author might be to the same person.

Coreference with Conditional Random Fields

In order to solve the problem, contextual features about each mention (e.g., in the above example, features from the title, co-author list, venue, year and author name) may be extracted and employed in a probabilistic model. These features are typically raw words, character n-grams and normalized variants thereof, often with positive real-valued weights to indicate the importance (e.g., via TFIDF (term frequency-inverse document frequency)) of each feature. Then, given such features, a coreference model measures the similarities between mentions via functions such as cosine-similarity.

Typically, the model is a discriminative conditional random fields (CRF) model that measures the probability of an assignment of mentions to entities conditioned on the observed features. The model factorizes into potentials that score local coreference decisions. In pairwise models, potential functions measure the compatibility of two mentions being in the same cluster whereas in entity-based models, entities are treated as first-class variables with their own set of inferred features and potentials measure compatibility between mentions and entities. Local search procedures such as greedy-agglomerative clustering or Markov-chain Monte Carlo (MCMC) find the most likely assignment of mentions to entities.

Hierarchical Coreference

A hierarchical conditional random field model is a type of entity-based model that organizes mentions into latent tree structures, for example as illustrated in FIG. 1. Latent entity nodes (white boxes 100 and 102) summarize subtrees. Pairwise factors (black squares) measure compatibilities between child and parent nodes, which helps to avoid quadratic blow-up. Corresponding decision variables (open circles) indicate whether one node is the child of another. Mentions 104 (gray boxes) are leaves. There is one tree per entity 100 with mentions 104 at the leaves and intermediate nodes 102 that organize subsets of the entity 100's mentions 104. Rather than modeling interactions between mention-pairs, the potential functions measure compatibility between child and parent nodes in the tree. The score of a given assignment of mentions 104 into latent trees is the product of all model potentials which include these child-parent compatibility scores as well as some additional priors on tree-shape and entities. These compatibility scores are parametrized cosine functions, making SimHash a suitable representation for the features. Deciding whether to merge entities 100A and 100B requires evaluating just a single factor (gray square), corresponding to the new child-parent relationship.

Conventional implementations of hierarchical coreference employ sparse-vector representations for the features. The reason is that only a small handful of features are ever observed for a given mention; if a dense-vector representation is employed, most entries would be 0 which is wasteful. However, a disadvantage of sparse vector representations is that they store the indices and weights of the non-zero elements which means that the data-structures dynamically change in size as MCMC splits and merges entities. As the size of the entities grow, these operations become increasingly expensive. Thus, the representation used in embodiments provides an appealing alternative since it allows a dense fixed-dimensional vector representation of the sparse bags-of-words to be employed that is easy to maintain with basic vector arithmetic implemented with arrays for efficiency. A challenge is that the traditional SimHash bit-vector representations are not homomorphic with respect to addition and partial subtraction, so in embodiments the SimHash algorithm is modified to support dynamic features. The role of SimHash is discussed more precisely below in the context of the model, and in the following section.

Each mention is endowed with multiple feature variables that each captures a subset of the total features. For example, in author coreference, one feature variable might capture features of the author's name and another might capture features of the title and venue of the paper. These feature variables may be referred to as "bags" since they inherit the usual bags-of-words assumption. In natural language processing (NLP) it is customary to represent these features as a sparse vector for tracking the nonzero elements. The size of the representation thus grows with the number of observed features, but the size remains fixed during inference; thus these are referred to as static features. The SimHash representation implemented in embodiments is a viable alternative for representing these features. And since the size of the representation does not grow with the number of features, this allows a practitioner to perform feature engineering uninhibited by the usual computational concerns.

The other nodes in the tree also contain feature variables (bags), but the values of these variables are determined by the current assignment of children to that parent node. In particular, each bag for each parent is the sum of all children's corresponding bag. Note that the usual sparse-feature vector representation can be employed for these bags, but because their values change during inference, maintaining them can become an expensive process, especially as the number of features gets larger as the entities grow in size. Since these feature change during inference, they may be referred to as dynamic features. Note that the SimHash representation is especially ideal for these features because the size of the SimHash representation remains fixed regardless of the number of features. Further, as will become apparent later, maintaining the values of the parent's SimHash representation can be done in the compressed representation with simple addition and subtraction of low-dimensional dense vectors.

The primary potential functions measure the compatibility between a child's bag and its parent's bag. There is one potential for each bag-type. For example, to measure the compatibility between a node $z_i$ and $z_j$, let $y_{ij}$ be the binary variable that is 1 if and only if $z_j$ is the parent of $z_i$, and let $b_i^{(1)}$ and $b_j^{(1)}$ be a bag for $z_i$ and $z_j$ respectively, then the potential $\psi^{(1)}$ for the first bag scores a coreference decision as:

$$\psi^{(1)}(z_i, z_j, y_{ij}) = \begin{cases} 1 & y_{ij} = 0 \\ \exp(w(\cos(b_i^{(1)}), b_j^{(1)}) - b_i^{(1)}) - t) & o.w \end{cases} \quad (9)$$

where w is a real-valued weight and t is a real-valued translation parameter.

Embodiments may employ a better representation of each of these bag variables such that (A) the model still supports these cosine-similarity-based potential functions and (B) the model allows inference to operate directly on the compressed representations while preserving the cosine estimate. This is where homomorphic compression proves useful.

Homomorphic SimHash

As MCMC splits and merges the hierarchical entities, the SimHash representations of nodes need to be updated. In particular, if nodes are joined with feature vectors a and b, then the vector of their new parent will be a+b. However, if only H(a) and H(b) are stored, rather than the vectors a and b themselves, H(a+b) cannot be computed: the ith bit of H(a) and H(b) just records the sign of a·$h_i$ and b·$h_i$, and if these are different, the sign of (a+b)·$h_i$ cannot be determined. A similar problem occurs when a child with vector b is split from a parent with vector a, since the updated parent's hash should be H(a−b).

To overcome these limitations, in embodiments, the actual dot product of a·$h_i$ is stored as the hash of a, rather than just the sign. That is, H(a) is now an array of dot products of length n instead of a n-bit sequence. And since $(a+b) \cdot h_i = a \cdot h_i + b \cdot h_i$ and $(a-b) \cdot h_i = a \cdot h_i - b \cdot h_i$ H(a+b) can be computed by adding component-wise the arrays for H(a) and H(b), and similarly for H(a−b). Finally, the cosine distance between two vectors a and b can be efficiently computed by examining the signs of the entries of H(a) and H(b). This representation is referred to as homomorphic because H is a homomorphism with respect to the additive group structure on vectors.

Of course, storing each dot product instead of just the signs increases the size of the hashes. However, they are still small compared to the feature vectors, and more importantly, their sizes are fixed.

Example Data System

Figure 2:
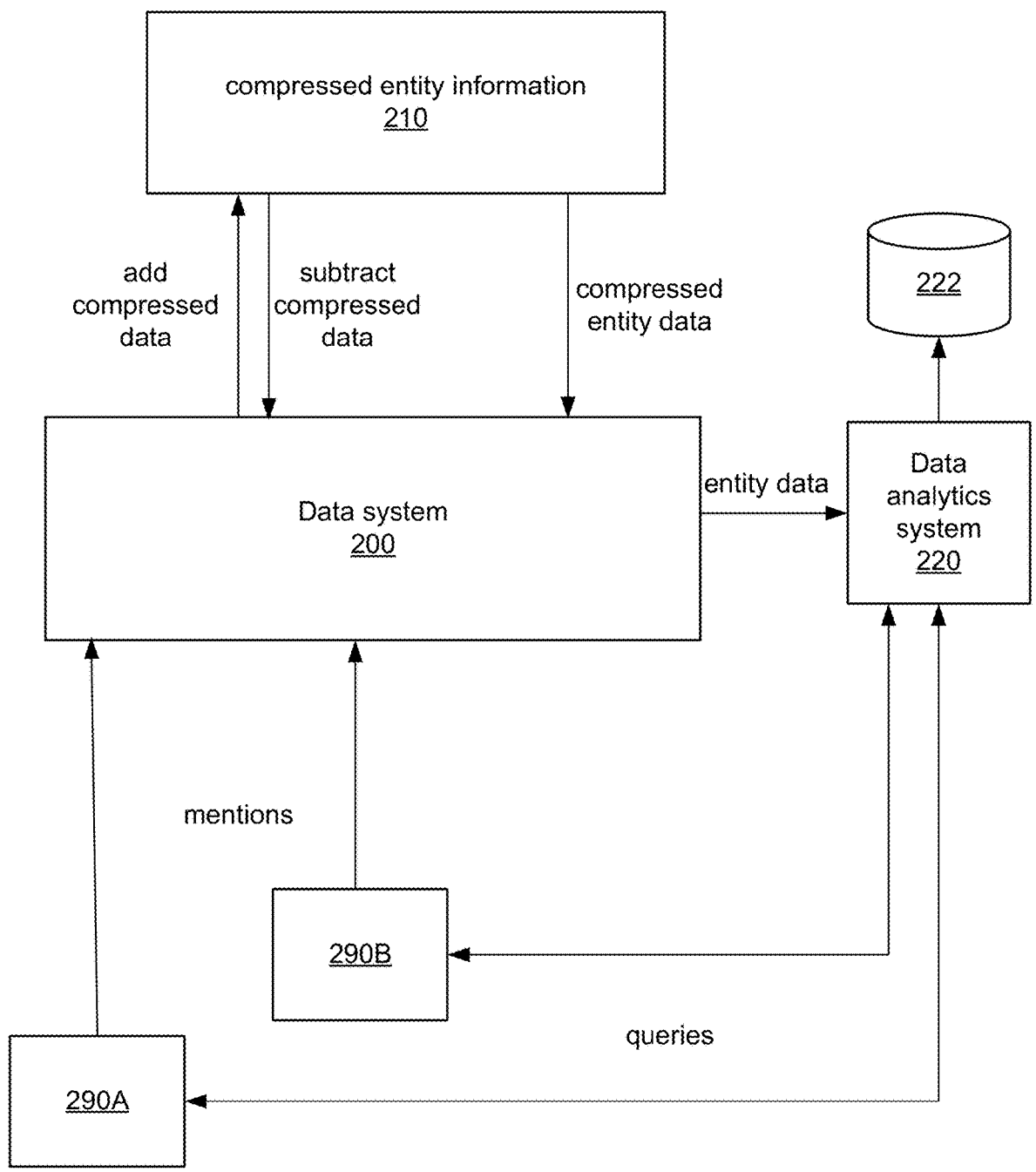
FIG. 2 shows an example data system that implements a modified locality sensitive hashing (LSH) method for a probabilistic model of hierarchical coreference, according to some embodiments.
Figure 9:
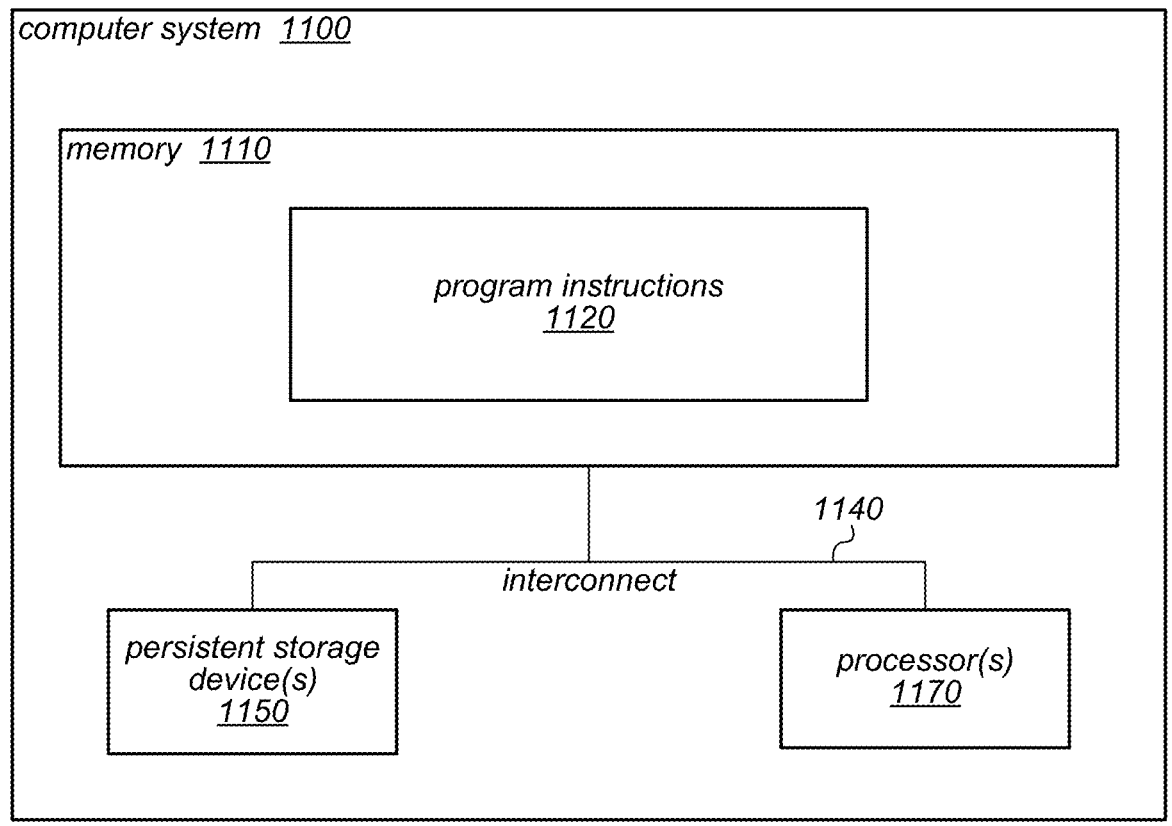
FIG. 9 illustrates an example computing system, according to various embodiments.

FIG. 2 shows an example data system 200 that implements a modified locality sensitive hashing (LSH) method (also referred to as homomorphic Simhash) for a probabilistic model of hierarchical coreference as described herein according to some embodiments, and is not intended to be limiting. Data system 200 may be implemented by one or more computing systems. An example computing system is shown in FIG. 9. Compressed entity information 210 may, for example, be stored as low-dimensional fixed-width feature vectors in a hierarchical conditional random field model, for example as illustrated in FIG. 1, on one or more network-based storage systems or storage devices. An entity may be a person, a company, etc. for which the data system 200 stores and manages compressed information.

In some embodiments, one or more external sources 290 (e.g., company databases) may communicate with data system 200 via an intermediate network, for example the Internet, to submit mentions (e.g., records of customers' transactions) to the data system 200. A mention may be a record that includes one or more features that may be used to identify an entity, along with other information such as purchase information. The mentions may be compressed according to the LSH methods described herein and added to compressed entity information 210 without requiring the mentions to be added to original uncompressed entity information and recompressing the entity information. In some embodiments, data may also be subtracted from the compressed entity information 210 without requiring the data to be subtracted from original uncompressed entity information and recompressing the entity information.

In some embodiments, data system 200 may manage the compressed entity information using the hierarchical coreference methods described herein. For example, the data system 200 may estimate the cosine similarity between entities as described herein to decide whether or not to merge two entities, or more generally to determine whether or not two entities with their associated mentions are the same entity. In some embodiments, entity data may be provided to a data analytics system 220.

In some embodiments, data analytics system 220 may query databases of sources 290 to obtain additional information about entities based on the entity data. For example, one entity may be identified as a customer of both sources 290A and 290B, and data analytics system 220 may query the databases of both sources to obtain information about that common customer. In some embodiments, data analytics system 220 may generate data set 222(s) that combine entity information obtained from the multiple sources 290 according to the matching entity data obtained from the data system 200.

Figure 3:
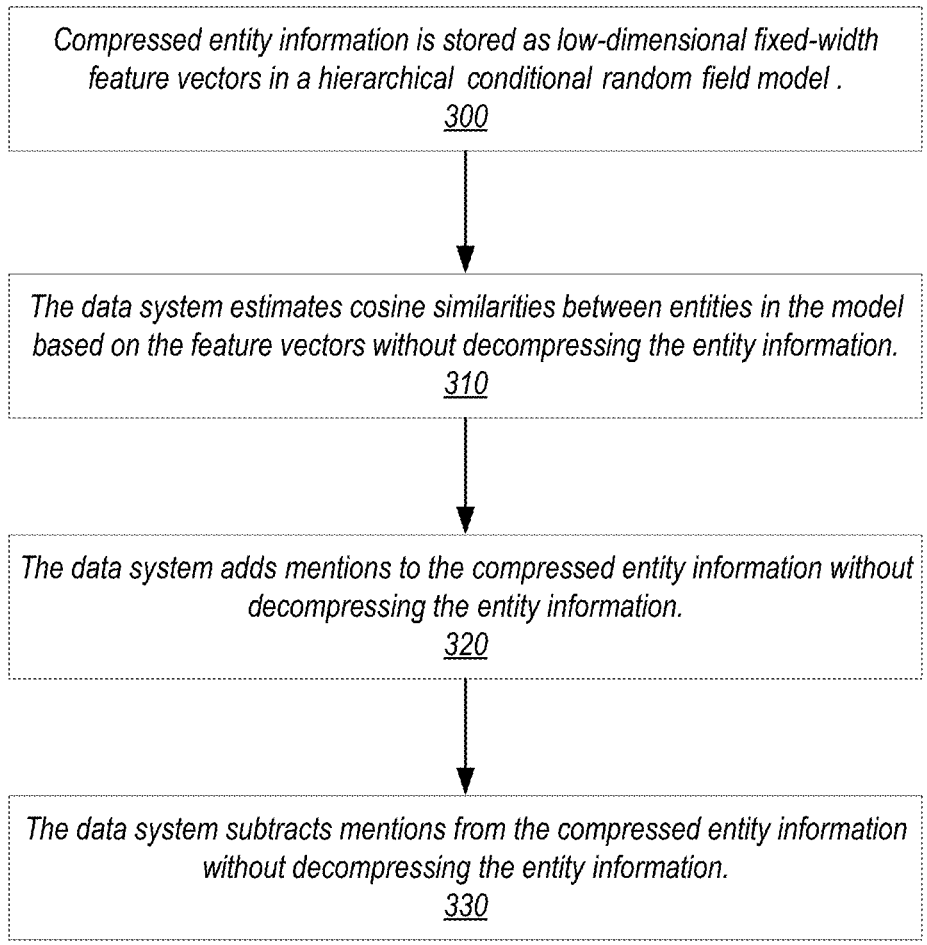
FIG. 3 is a flowchart of a method for scalable hierarchical coreference in a data system that implements a modified LSH method, according to some embodiments.
Figure 4A:
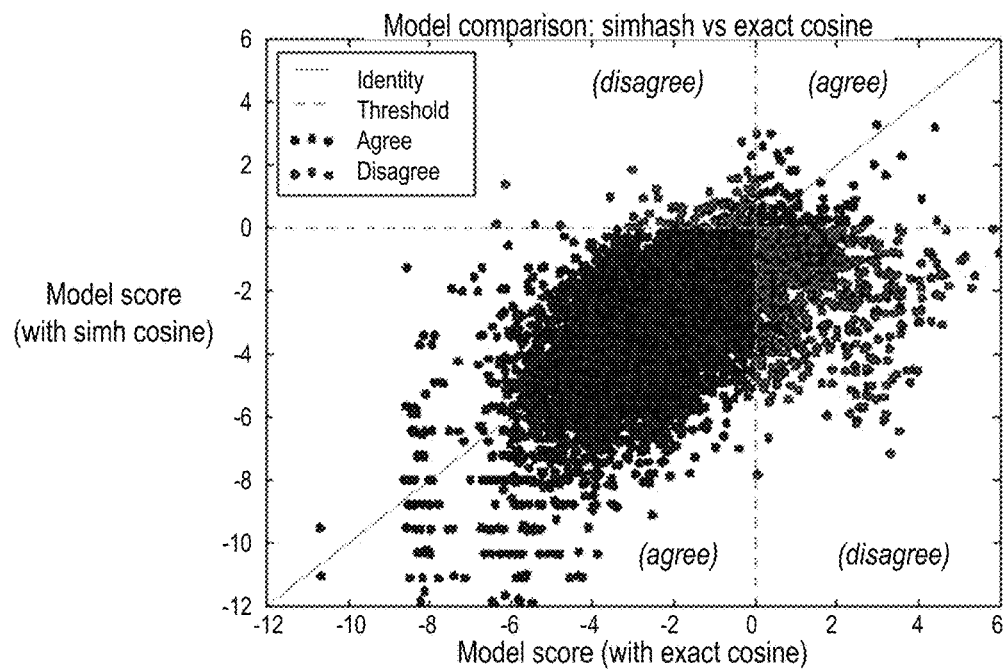
FIGS. 4A through 4D show model score comparisons with homomorphic SimHash and exact sparse-vector representations, according to some embodiments.
Figure 4B:
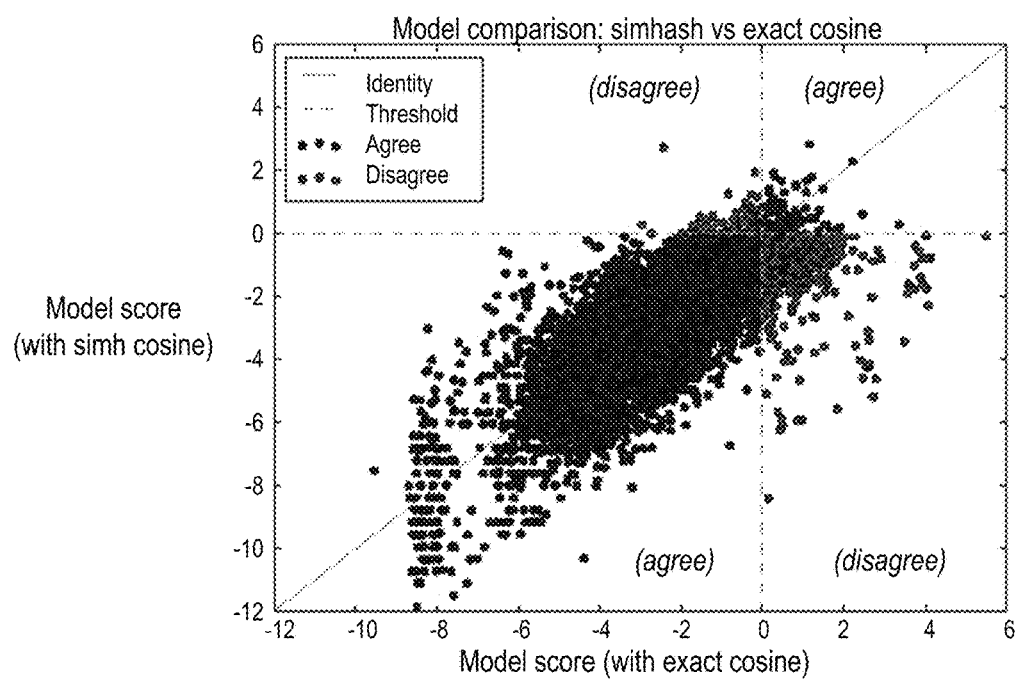
Figure 4C:
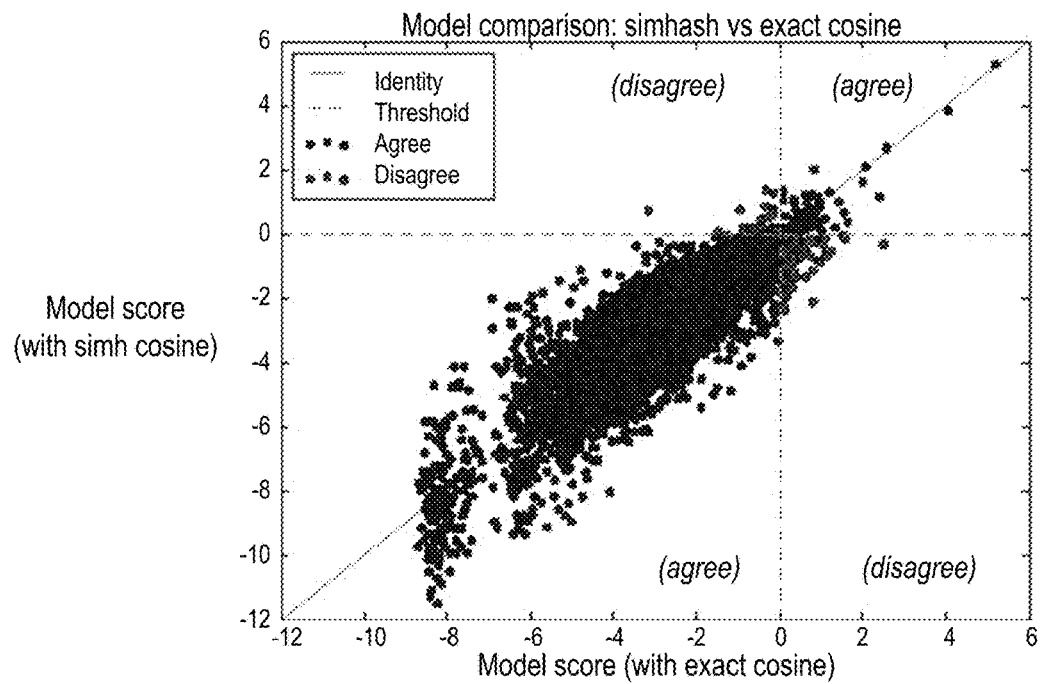
Figure 4D:
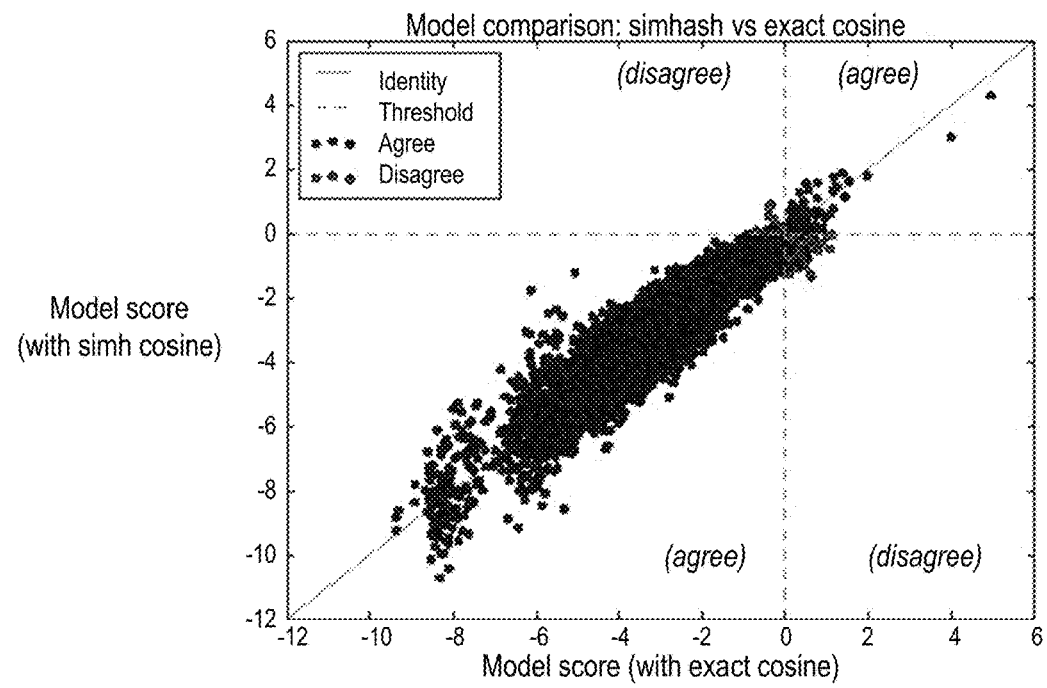

FIG. 3 is a high-level flowchart of a method for scalable hierarchical coreference in a data system that implements a modified LSH method, according to some embodiments. As indicated at 300, compressed entity information may be stored as low-dimensional fixed-width feature vectors in a hierarchical conditional random field model, for example as illustrated in FIG. 1, on one or more network-based storage systems or storage devices. An entity may be a person, a company, etc. for which the data system stores and manages compressed information. Each entity is represented as an entity node that forms a subtree in the model, wherein mentions associated with each entity are stored as leaf nodes of the respective entity node. Each mention is represented in the model as a low-dimensional fixed-width feature vector comprising n features, wherein the feature vectors are compressed according to a locality sensitive hash (LSH) function H that, for a feature vector a, stores a dot product $a \cdot h_i$ as the hash of a such that H(a) is an array of dot products of length n.

As indicated at 310, the data system may compute cosine similarity between entity nodes in the model based on the compressed feature vectors without decompressing the entity information.

As indicated at 320, the data system may add a compressed feature vector to the compressed entity information without decompressing the entity information. For example, the data system may determine, based on the compressed entity information, that two entity nodes in the model refer to a same entity, and may merge the two entity nodes in the model without requiring the compressed entity information to be decompressed. Merging the two entity nodes may include adding the compressed feature vectors of the two entity nodes, which can be done without requiring the compressed entity information to be decompressed. As another example, two models that include compressed information for two different (possibly overlapping) sets of entities may need to be merged, and two entities in the two models that are identified as the same entity (e.g., by computing cosine similarity of the two entity nodes) may be merged without requiring the compressed entity information to be decompressed.

As indicated at 330, the data system may subtract a compressed feature vector from the compressed entity information without decompressing the entity information. For example, a subtree formed by an entity node may have one or more intermediate nodes that organize subsets of the entity's mentions as leaf nodes. The data system may determine, based on the compressed entity information, that an intermediate node of an entity node refers to a different entity. The data system may then split the intermediate node from the entity node's subtree in the model to form a new subtree in the model with the intermediate node as the entity node without requiring the compressed entity information to be decompressed. Splitting the intermediate node from the entity node's subtree in the model may include subtracting the compressed feature vectors of the intermediate node from the entity node, which can be done without requiring the compressed entity information to be decompressed.

Experimental Results

This section discusses homomorphic SimHash applied to a real-world model and problem: a conditional random field (CRF) model of author coreference resolution, and compares representing the sufficient statistics of the CRF with SimHash to the typical CRF that employs an exact sparse-vector representation. Questions that are addressed include:

How many bits are needed to represent the sufficient statistics of a real-world model?

Does the error incurred from the SimHash representation have any profound consequences on the accuracy of the model?

How does SimHash affect the run-time performance of inference?

A first experiment investigates how accurately a model with SimHash representations mimics their exact counterparts in terms of the log-probabilities, the actual decisions the models make during inference, and in terms of the final F1 score on the coreference task. A second experiment shows how SimHash can improve the running-time of inference.

Data

The REXA labeled dataset is employed, which comprises 1400 mentions of seven ambiguous first-initial last-name combinations: D. Allen, A. Blum, S. Jones, H Robinson, S. Young, L. Lee, J. McGuire, A. Moore. The data is split such that training set contains mentions of the first four ambiguous names (about 1000 mentions) while the testing set comprises the remaining three names (about 400 mentions). While the REXA dataset contains human-labeled ground-truth for entities, the actual mentions themselves are noisy since conditional random fields (CRF) automatically extracts the attributes (e.g., author, title, venue, year, date, etc.).

In addition, for some of the experiments, the DBLP dataset is employed, which contains over one million citations from which about five million unlabeled author mentions are extracted.

Model

The homomorphic SimHash is investigated in the context of the hierarchical coreference model. Two types of feature variables are employed: a "name bag" that represents the features of the authors name and a "context bag" that represents the remaining features in the citation from which the author mention is extracted. In particular, the "name"

bag of each mention is populated with the full name, the first-initial last name, and character tri-grams of the author's name string as it appears in the mention. The "context" features of each mention are populated with the title and venue, the co-authors with whom the paper is authored, author-provided keywords for the paper. For the title white-space tokenization, character 3-grams and 4-grams are employed. For venue, white-space tokenization as well as the entire string are employed. For co-authors, the first-initial last-name of all co-authors are employed. Finally for topics, the top three topics for each citation are taken as determined by a 200-topic latent Dirichlet allocation (LDA) model trained on all of DBLP and REXA combined. The training data was employed to experiment with several feature combinations, including using all 200-topics for each citation, but it was found that this combination of features may work best.

The implementation of hierarchical coreference available in the FACTORIE toolkit was employed, using FACTORIE's implementation of the variables, the model and the inference algorithm. Additionally, the SimHash variables and potential functions are implemented inside this framework. FACTORIE's default inference algorithm is employed for hierarchical coreference which is essentially a greedy variant of multi-try Metropolis-Hastings in which the proposals make modifications to the sub-trees (e.g., move a subtree from one entity to another, or merge two trees under a common root node).

The model is tuned with exact feature representations on the training data with the help of hyper-parameter search. Identical parameters are used for the SimHash model, except that the translation value for the context bag is lowered to compensate for the extra variance that can increase the chance of false-positives.

Experiment 1

In this experiment, models are compared with a SimHash representation of the features and statistics directly to an exact representation.

First, SimHash models are compared to the exact model during the course of MCMC inference to see how the models evaluate the various intermediate results of inference. In particular, MCMC is run for 100,000 steps to optimize SimHash-based models on the REXA test set (with 32, 64, 128, and 256 bits). FIGS. 4A through 4D show model score comparisons with homomorphic SimHash and exact sparse-vector representations for 32, 64, 128, and 256 bits, respectively. The chain begins with the singleton configuration (all mentions in their own entity tree of size one), proposing changes to the state at each time-step that the model decides to accept or reject, and gradually produces larger and larger trees as it infers the entities. For each proposed state change (sample), the log model ratio of both the SimHash model and the exact model are recorded. The closer the points are to the identity reference line y=x, the more accurate the SimHash model is for those points. Every tenth sample is shown in a scatter plot in FIGS. 4A through 4D. As would be expected, increasing the number of bits reduces the error of the SimHash model with respect to the exact model, and this difference is substantial.

Further, for each proposed state change (MCMC step) made under the SimHash model, the question can be asked: do the two models agree on whether or not to accept the proposed state change? This is indicated on the scatter plots in FIGS. 4A through 4D by shading points darker (agree) or lighter (disagree): the agreement rates are 88.6, 83.6, 97.0, and 97.8 percent respectively for 32, 64, 128, and 256 bits. The decision boundaries (for state acceptance) are plotted with a dashed line so that these points can be interpreted in black and white. The upper-left and lower-right quadrants contain all the points for which the two models disagree, while the other two quadrants contain points for which they agree. In particular, the upper-right quadrants contain the points that both the SimHash model and exact model believes should be accepted (true positives), while the lower-right quadrants contain the points that both models think should be rejected (true negatives). Most points lie in this quadrant as would be expected since the jump is fairly random and the chance of proposing a fruitful move is relatively low. The points in the upper-left quadrant correspond to proposals for which the SimHash model accepts, but the exact model would not accept (false-positives), while the lower-left quadrant corresponds to false-negatives. Again, it can be seen in FIGS. 4A through 4D that the number of bits can have a large effect on the number and types of errors. Visually, there appears to be a gap between 64 bits (FIG. 4B) and 128 bits (FIG. 4C) on this data, leading to a recommendation of using at least 128 bits.

While it is useful to understand the behavior of the approximation during inference and how it compares to an exact model, it needs to be determined whether or not the approximation is sufficient for tackling the problem of author coreference. Therefore, the coreference performance is also evaluated with B-cubed (B3) F1, for each model. The exact model achieves an F1 of 78.7, while the SimHash variants achieve F1 scores of 77.6, 75.6, 62.8, 55.6 for 256, 128, 64, 32 bits respectively. Overall, the accuracy of the 128 and 256-bit models are reasonable with 256 being competitive with the performance of the exact model. When using fewer bits, again, the performance decreases precipitously.

Figure 5A:
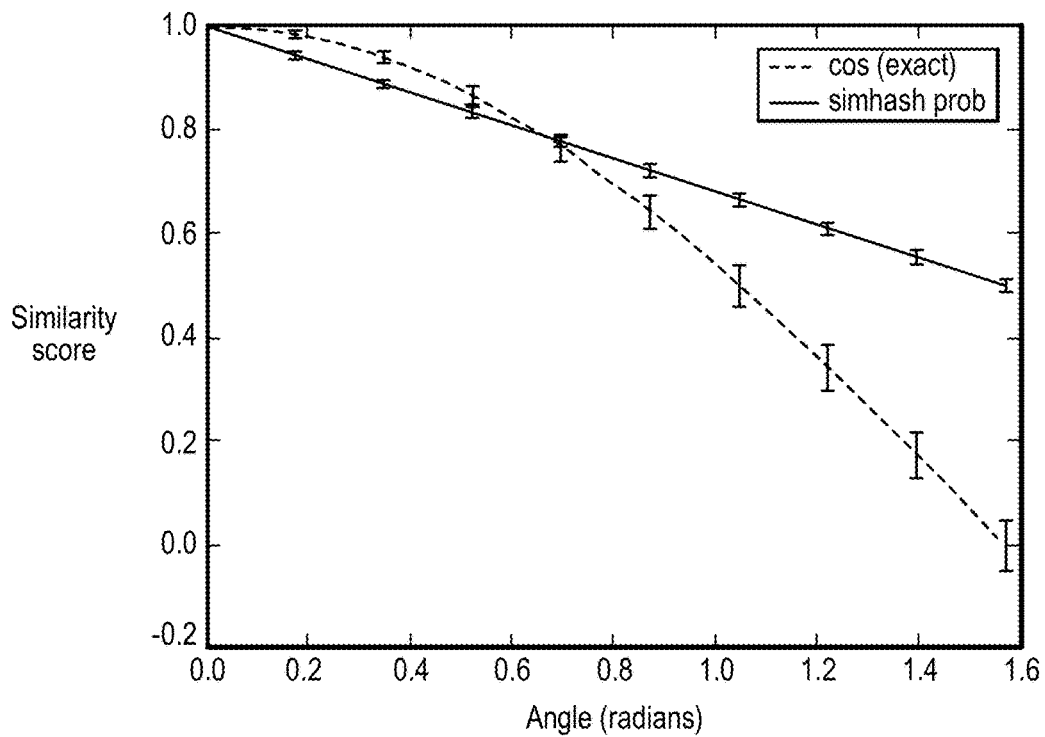
FIG. 5A compares exact cosine with two SimHash approximations, according to some embodiments.
Figure 5B:
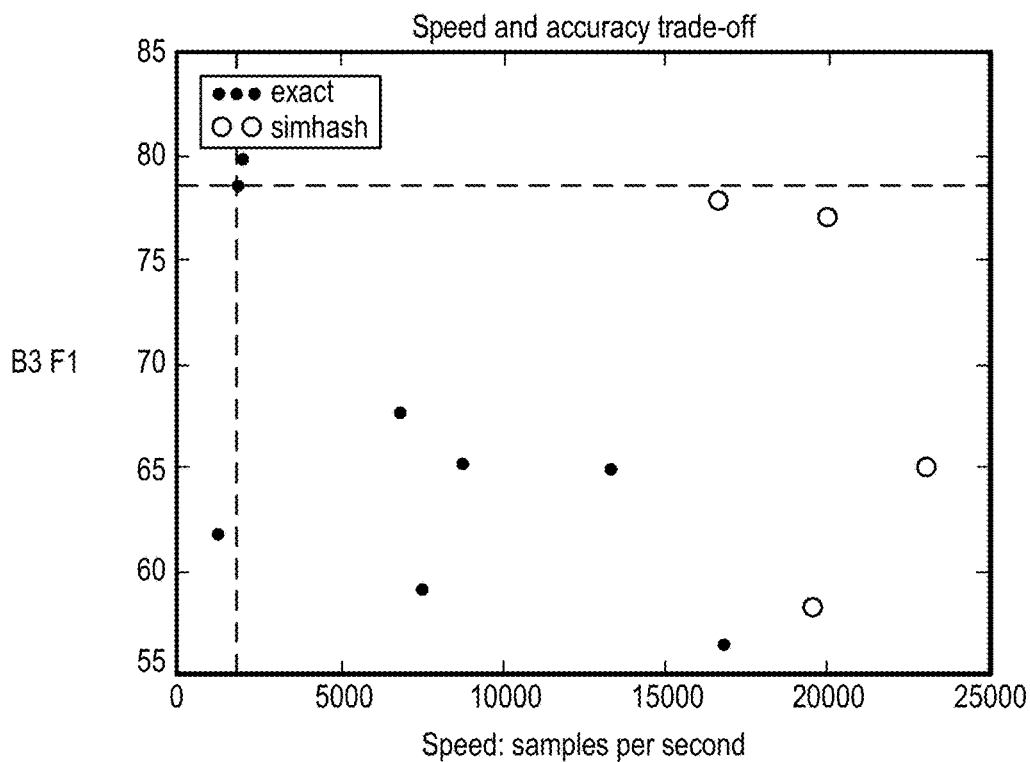
FIG. 5B shows accuracy versus speed as the number of features for the exact model and number of bits for SimHash are varied, according to some embodiments.
Figure 6A:
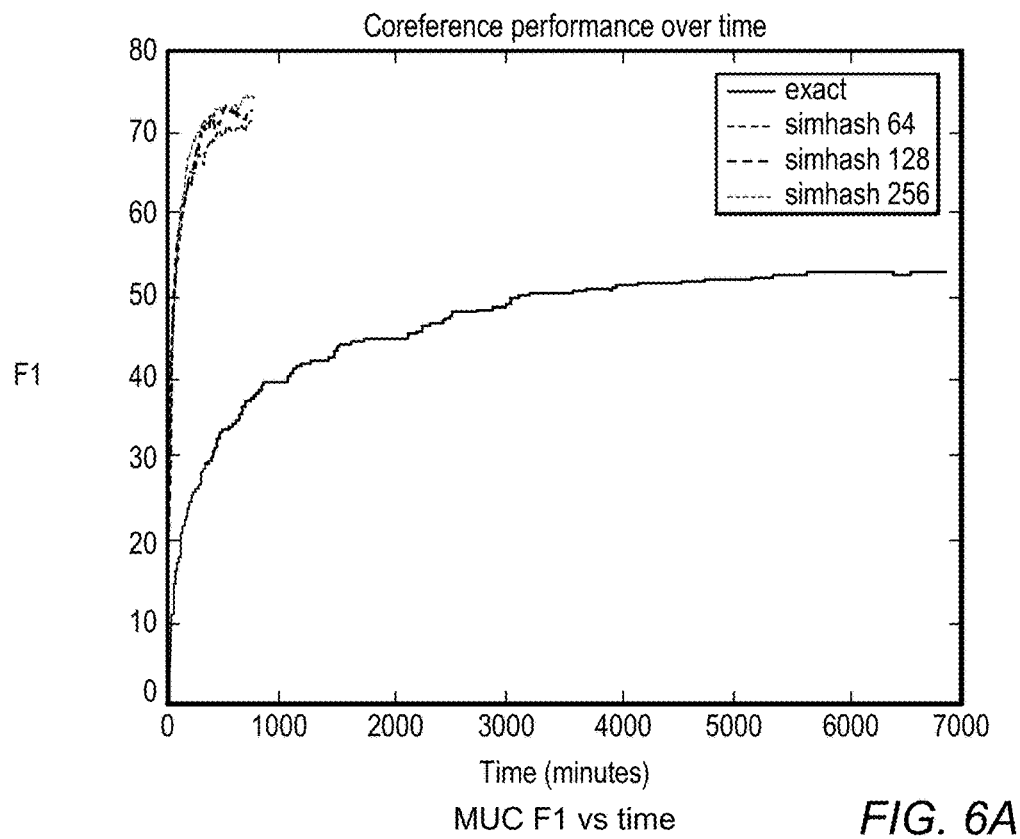
FIGS. 6A through 6D show comparisons of hierarchical coreference models that employ either SimHash or exact sparse-vector representations of the features, according to some embodiments.
Figure 6B:
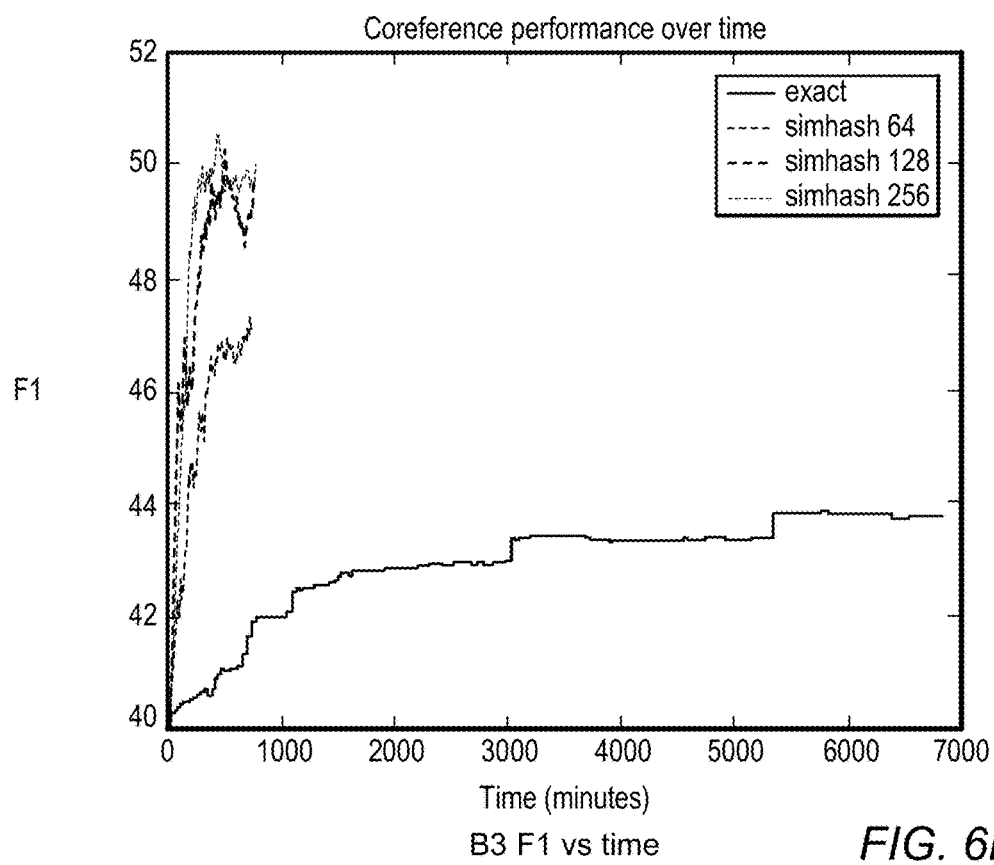
Figure 6C:
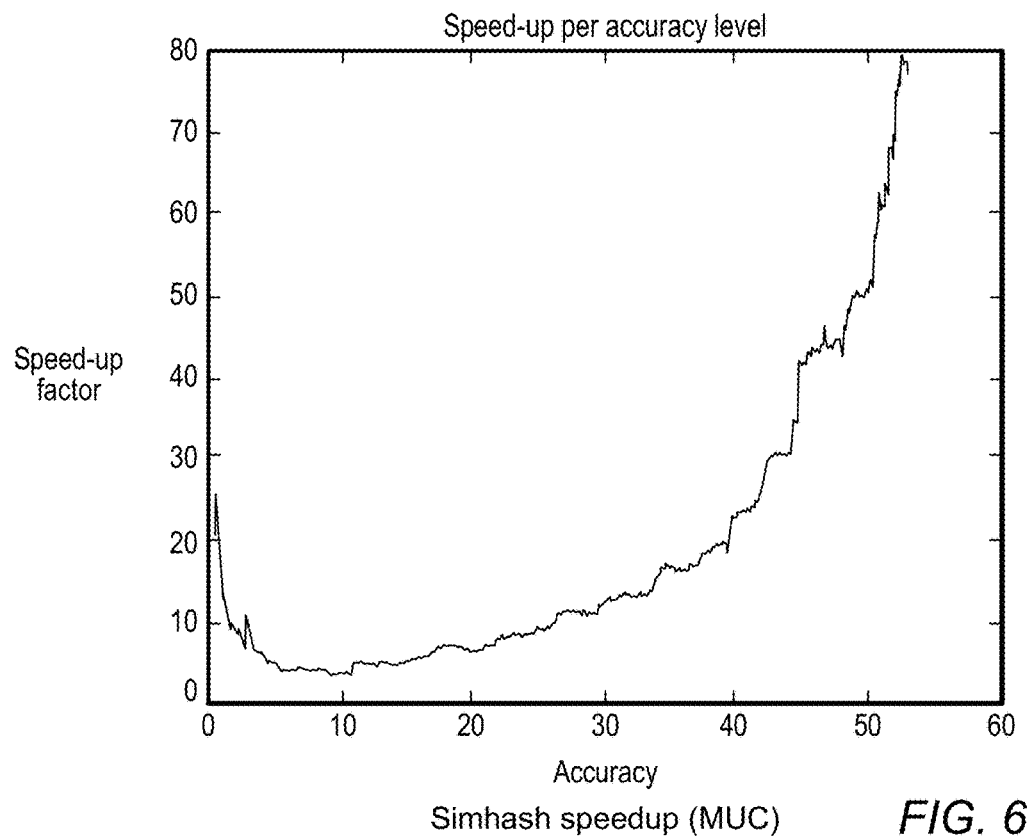
Figure 6D:
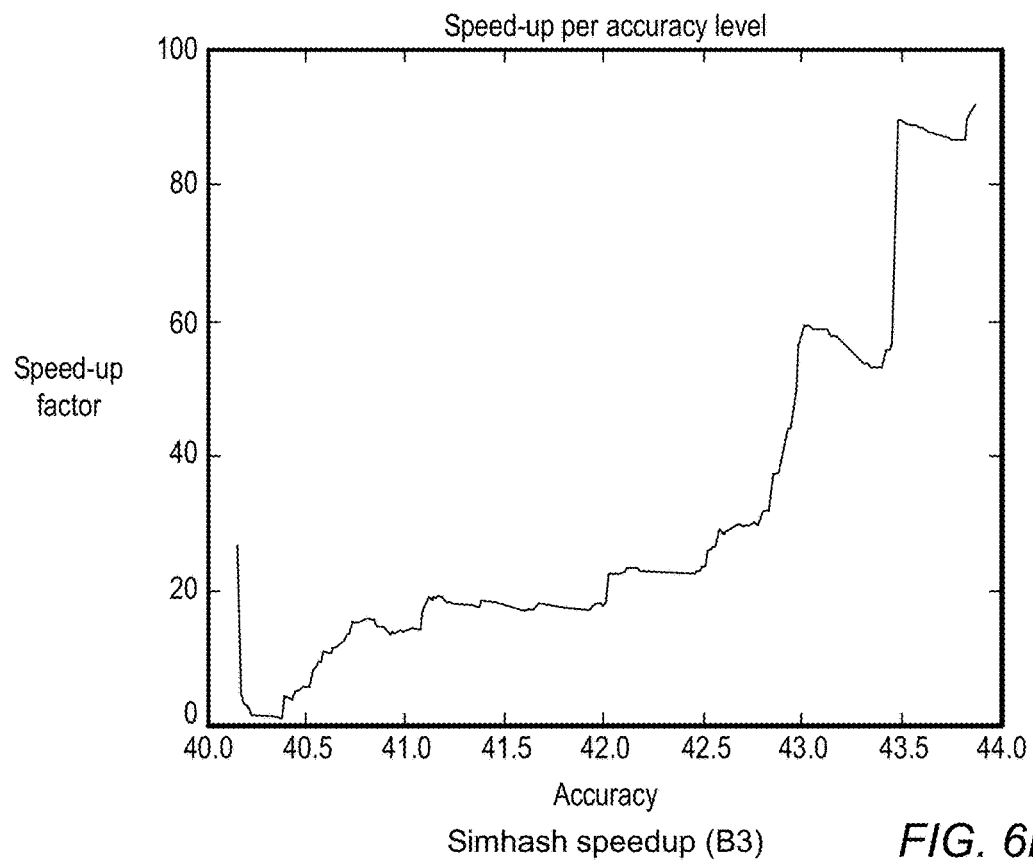

FIG. 5A compares exact cosine with two SimHash approximations. The first SimHash approximation is the usual linear approximation depicted as the linear curve with error bars. The second SimHash approximation estimates theta and plugs this directly into SimHash, depicted as the error bars on the exact cosine curve. Error bars are the standard-error of 32-bit hashes. FIG. 5B shows accuracy versus speed as the number of features for the exact model and number of bits for SimHash are varied.

FIGS. 6A through 6D compare the hierarchical coreference models that employ either SimHash or exact sparse-vector representations of the features. SimHash representations result in large speedups and have little effect on accuracy. The number after SimHash indicates the number of bits employed by the hash function and hence the dimensionality of the underlying arrays.

Locality Sensitive Hashing with Addition and Partial Subtraction

Locality Sensitive Hashing

Imagine two vectors a and b on the unit hypersphere in the Euclidean space $R^d$ with angle $\theta$ between them and a random hyperplane chosen uniformly at random with orthogonal vector u. Note that the probability that the two vectors end up on a different side of the hyperplane is:

$$\mathbb{P}(\text{sign}(a \cdot u) \neq \text{sign}(b \cdot u)) = 1 - \mathbb{P}(\text{sign}(a \cdot u) = \text{sign}(b \cdot u)) \quad \text{(B1)}$$

$$= 1 - \frac{\theta}{\pi} \quad \text{(B2)}$$

which is a reasonably good estimate of $\cos(\theta)$. Let the random variable X be the result of choosing an orthogonal vector uniformly at random and testing whether a and b are on the same side of the hyperplane induced by u:

$$E[X] = 1 - \frac{\theta}{\pi} \quad (B3)$$

and so this randomized test is an unbiased estimate of an approximation of the cosine similarity between vectors a and b. Letting the family of random variables $X_1, \ldots, X_n$ be the result of repeating this process several times, then by linearity of expectation E:

$$E\left[\frac{1}{n}\sum_{i=1}^{n} X_i\right] = 1 - \frac{\theta}{\pi} \quad (B4)$$

which remains an unbiased estimate, and since $X_1, \ldots, X_n$ are independent:

$$V\left[\frac{1}{n}\sum_{i=1}^{n} X_i\right] = \frac{1}{n^2}\sum_{i=1}^{n} V[X_i] \quad (B5)$$

so the variance V decreases quadratically with the number of tests. This idea can be used to hash vectors into a few bits (1 bit per test) in such a way that the cosine similarity between vectors is preserved.

This concept is generally called locality sensitive hashing (LSH), and this specific instantiation for cosine similarity is called SimHash.

Fast LSH with Hash Functions

Note that the orthogonal vector is not necessarily chosen from the unit hypersphere, but could instead be chosen from $B^d$ by choosing d bits independently and uniformly at random. This approximation is coarser but remains precise in high dimensions. Let u be such a bit vector. To compute the dot product between a vector a and the hyperplane induced by u, $u_i$ is multiplied by $a_i$ for every dimension i. An equivalent but computationally advantageous alternative is to choose a 1-bit hash function h at random from a family of hash functions and compute $h(i) \times a_i$ for each dimension i. Note that this needs to be done only for dimensions where $a_i$ is strictly positive. In one dimension, the hash of a vector a is therefore defined as:

$$\text{sign}(\Sigma_{i=1}^{d} h(i) \times a_1) \quad (B6)$$

To enable a higher number of dimensions with different hyperplanes, a b-bit hash function can be chosen at random from the family of uniform hash functions. In conclusion, a procedure can be provided to hash vectors into b bits and in such a way that the cosine similarity between vectors can be estimated.

Note that this approach might be biased. For example, due to multiplicity of words, and the fact that there are only a finite number of hyperplanes, it is possible that two vectors might be different in the sense that they have a cosine similarity less than one, but are not separable by any hyperplane. For example, consider the two-dimensional case corresponding to a two-word vocabulary "hot" and "dog". The documents "hot hot dog" and "hot hot hot dog" correspond to the vectors $\langle 2, 1 \rangle$ and $\langle 3, 1 \rangle$. In two dimensions there are only four possible hyperplanes and because of symmetry, only two need to be considered. The orthogonal vector corresponding to one is $h^1 = \langle -1, 1 \rangle$ and the other is $h^2 = \langle 1, 1 \rangle$. Clearly neither of these hyperplanes separate the points since their inner products always have the same sign. Thus, this method always incorrectly estimates their cosine similarity as 1. In contrast, the documents "hot hot dog" and "hot dog dog" are separable by $h^2$.

While the two dimensional illustration seems problematic, the bias of this approach can be characterized, and it turns out that it is accurate for higher dimensional spaces. For the cases in which the two vectors are not separable, the method estimates their similarity to be one, but this is often acceptable since the vectors are likely to have a high cosine similarity anyway. For cases when the vectors are separable, the question can be asked: how many hyperplanes separate them? Since the hyperplanes are evenly distributed in the space, the answer is $\lfloor \theta/\pi N \rfloor$ where $\theta$ is the angle between them and $N=2^d$ is the number of total hyperplanes. Thus, for such cases, the hash function variant of SimHash yields the following expected separation probability:

$$E[X] = 1 - \frac{\lfloor \theta/\pi N \rfloor}{N} \quad (B7)$$

In comparison to Equation B3, there is some bias due to the rounding-down of the finite number of hyperplanes. Note, however, that as N tends to infinity, the bias goes away. While N is finite, it is still very large in practice since the number of hyperplanes N is exponential in the dimensionality of the vocabulary V, that is, $N=2^V$. Further, N may be large in practice because this algorithm is applied exactly in cases where there is a need to cope with the high dimensionality of the data. For many applications this method works well in practice; however, Gaussian vectors may be employed as an alternative if there is concern about the bias.

Homomorphic LSH for Cancellative Commutative Monoids

In machine learning, and more specifically in hierarchical probabilistic graphical models, it is common to work with cancellative commutative groups, and it can be seen that this is indeed the case of an algorithm of interest: hierarchical coreference resolution on factors graphs. A cancellative commutative monoid is a commutative monoid (with operator +) that satisfies the cancellation rules:

$$t+u=t+v \rightarrow u=v \quad (B8)$$

In such structures, the partial subtraction u−v can be defined when u≥v. Unfortunately, the SimHash hashing scheme described above does not allow the direct computation of addition and difference on the hash representation. A solution is to delay the evaluation of the sign. That is, instead of representing the vector as:

$$\text{sign}(\Sigma_{i=1}^{d} h(i) \times a_i)$$

the vector is represented as:

$$\Sigma_{i=1}^{d} h(i) \times a_i \quad (B9)$$

A cost of this is that instead of representing the outcome of a test using a single bit, enough bits need to be used to represent the biggest possible value for any which in practice is expected to be quite low, but more than 1. However, it can be verified that for any vectors a and b:

$$h(a+b)=h(a)+h(b) \quad (B10)$$

and for any vectors a and b such that for all i, $a_i > b_i$:

$$h(a-b)=h(a)-h(b) \quad (B11)$$

Again, this representation can be extended to multiple dimensions by using hash functions with several bits of range as long as they come from a uniform family. Finally, the cosine similarity between two vectors a and b can be estimated by testing if sign(a)=sign(b).

Additional Experimental Results

Two implementations of hierarchical coreference are compared: one that employs an exact sparse-vector representations of the feature vectors (the default FACTORIE implementation), and another that employs the approximate SimHash variant. For SimHash, 128 bits are employed, and rather than employ the cosine approximation given in Equation B4, the method solves for an estimate of theta and plugs this into cosine. A reason for this is that the linear approximation is too coarse for the application and yields similarity values that are too large (i.e., 0.5) when the vectors are orthogonal. To see a visualization of these functions over the angle range 0 to 90 degrees, see FIG. 7.

Figure 7:
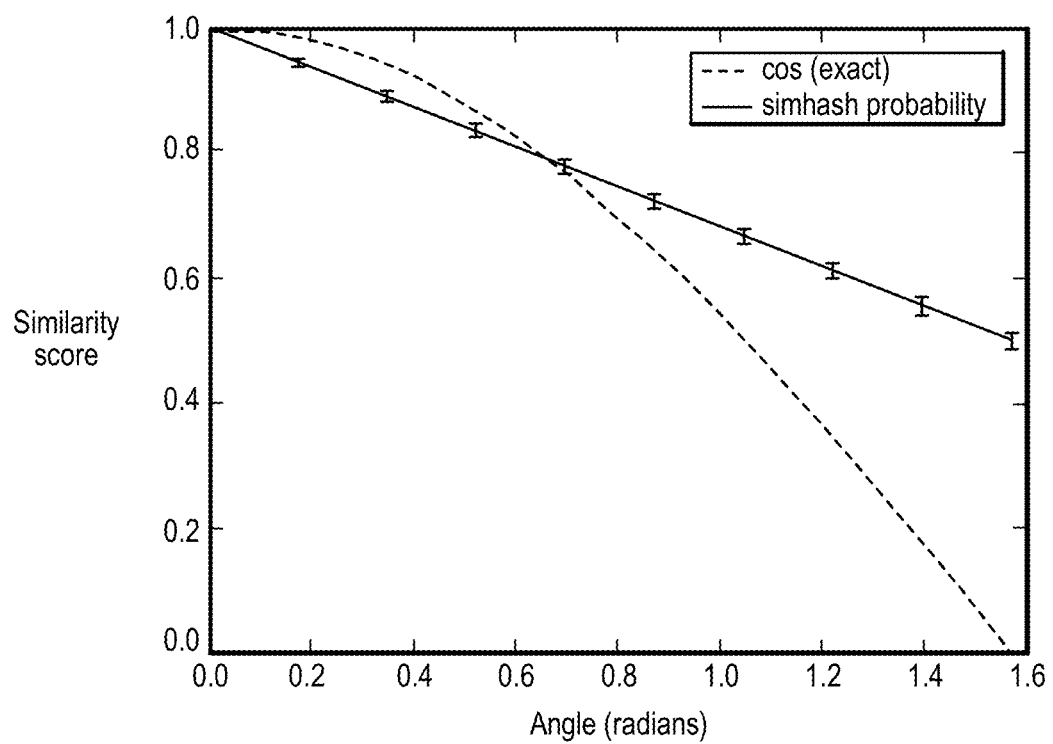
FIG. 7 show a comparison of the linear SimHash approximation and the true cosine similarity over the angle range 0 to 90 degrees, according to some embodiments.

FIG. 7 compares the linear SimHash approximation (simh-prob from Equation B4) and the true cosine similarity over the angle range 0 to 90 degrees (expressed in radians in the figure). The error bars (standard error) for SimHash are computed analytically with Equation B5 and assume 128-bit hash functions.

Figure 8A:
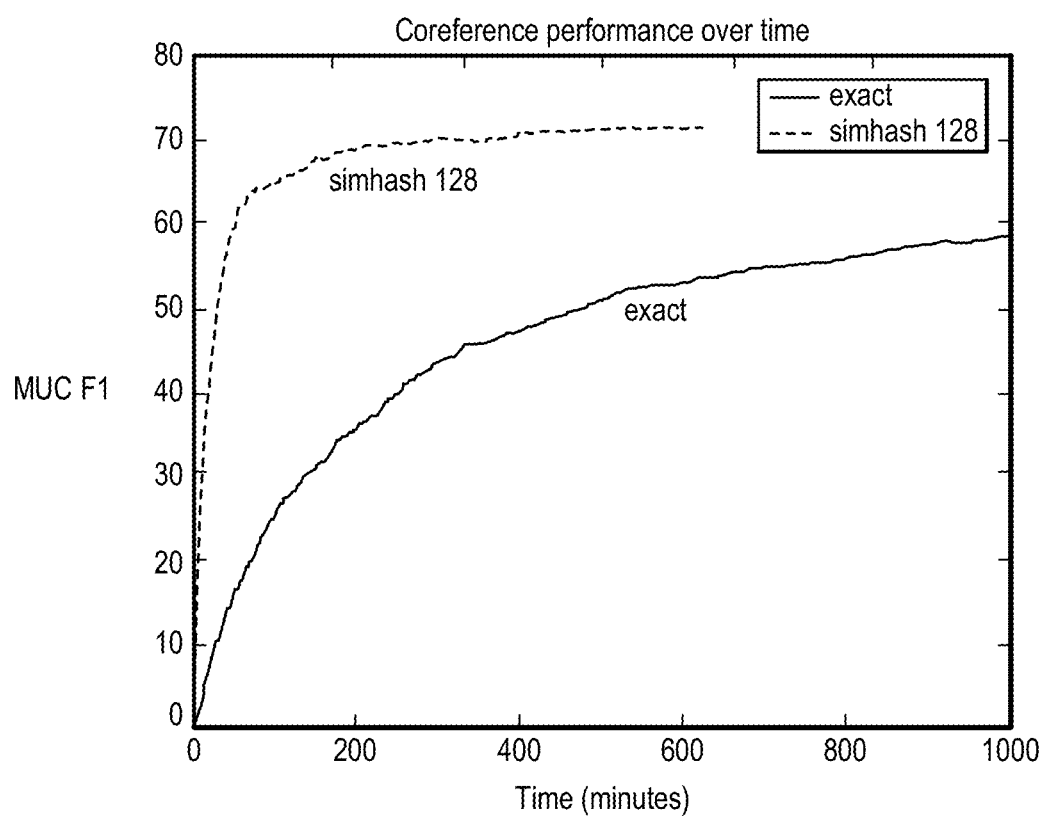
FIGS. 8A through 8C show comparisons of hierarchical coreference models that employ either SimHash or exact sparse-vector representations of the features, according to some embodiments.
Figure 8B:
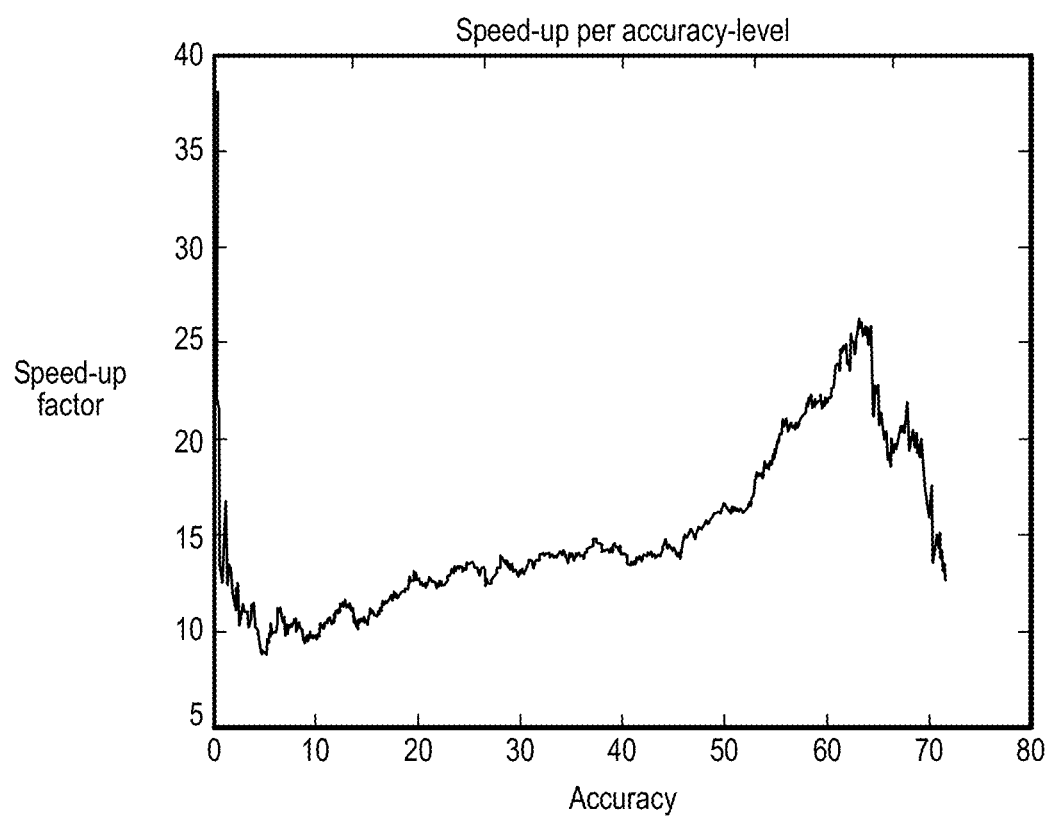
Figure 8C:
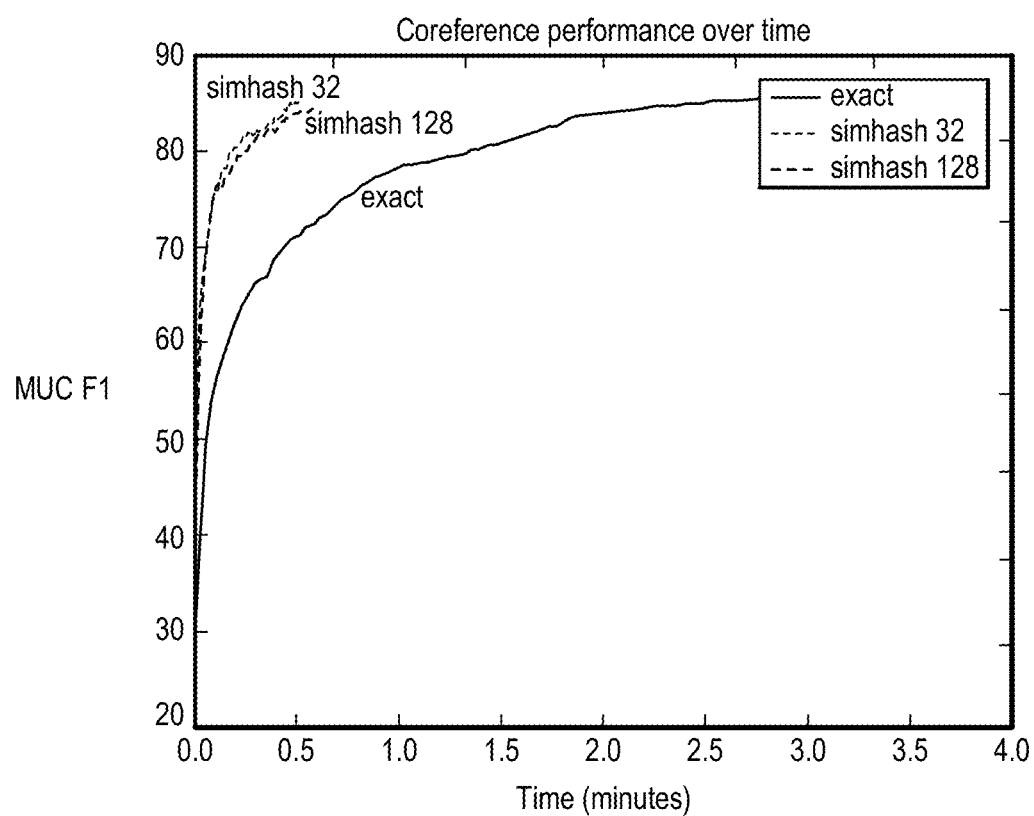

FIGS. 8A through 8C compare the hierarchical coreference models that employ either SimHash or exact sparse-vector representations of the features. SimHash representations result in large speedups and have little effect on accuracy. The number after SimHash on the legends indicates the number of bits employed by the hash function and hence the dimensionality of the underlying arrays.

The hierarchical coreference models are run for one-billion samples on five million author mentions of which about one-thousand are labeled with the ground-truth entity, allowing us to evaluate the F1 accuracy. FIG. 8A shows a plot of the F1 accuracy (y-axis, higher is better) as a function of wall-clock running time (x-axis). As can be seen, the variant that employs SimHash runs much faster. To further illustrate this, FIG. 8B shows a plot for a given level of accuracy (x axis), the speedup (y-axis) obtained by SimHash and see that is almost always a base-10 order of magnitude faster. Note that the speed-up increases over time. This is because the size of the entities grows over time which causes the sparse vector implementation to become slower. Indeed, the sparse vector representations drops from about 3000 samples-per-second to below 2000 samples-per-second while the SimHash variant remains at a constant 30,000 samples per second throughout the entire experiment (dipping only slightly towards the end due to other book-keeping factors).

Both variants of hierarchical coreference are also run on a smaller dataset of just the 1400 labeled mentions and their co-authors to get a better sense of the quality of their final convergence point. As seen in FIG. 8C, these results are promising as both variants achieve a similar level of accuracy. Thus, it can be concluded that SimHash can provide an order of magnitude speedup while preserving the accuracy of the model.

Example System

FIG. 9 illustrates a computing system configured to implement the systems and methods described herein, according to various embodiments. The computer system 1100 may be any of various types of devices, including, but not limited to, a personal computer system, desktop computer, laptop or notebook computer, mainframe computer system, handheld computer, workstation, network computer, a consumer device, application server, storage device, a peripheral device such as a switch, modem, router, etc., or in general any type of computing device.

In various embodiments, computer system 1100 may include one or more processors 1170. One or more of the processors 1170 may be multicore processors that implement monolithically integrated voltage regulators (MIVRs) as described herein. The computer system 1100 may also include one or more persistent storage devices 1150 (e.g. optical storage, magnetic storage, hard drive, tape drive, solid state memory, etc.) and one or more system memories 1110 (e.g., one or more of cache, SRAM, DRAM, RDRAM, EDO RAM, DDR 10 RAM, SDRAM, Rambus RAM, EEPROM, etc.). Various embodiments may include fewer or additional components not illustrated in FIG. 9 (e.g., video cards, audio cards, additional network interfaces, peripheral devices, a network interface such as an ATM interface, an Ethernet interface, a Frame Relay interface, etc.) The one or more processors 1170, the storage device(s) 1150, and the system memory 1110 may be coupled to the system interconnect 1140. One or more of the system memories 1110 may contain program instructions 1120 executable by the one or more processors 1170.

Although the embodiments above have been described in considerable detail, numerous variations and modifications will become apparent to those skilled in the art once the above disclosure is fully appreciated. For example, although embodiments are described in terms of particular types of data systems, it should be noted that the scalable hierarchical coreference methods may be applicable in other contexts that are different than those described in the examples herein. It is intended that the following claims be interpreted to embrace all such variations and modifications.

What is claimed is:

1. A system, comprising:
one or more storage devices;
one or more processors; and
a memory comprising program instructions executable by the one or more processors to perform:
compressing entity information representing mentions associated with a plurality of entities on the one or more storage devices;
wherein said compressing comprises representing each mention in the compressed entity information as a low-dimensional fixed-width feature vector comprising n features, wherein the feature vectors are compressed according to a locality sensitive hash (LSH) function H that, for a feature vector a, stores a dot product $a \cdot h_i$ as the hash of a such that H(a) is an array of dot products of length n; and
storing the compressed entity information on the one or more storage devices.

2. The system as recited in claim 1, wherein the program instructions are further executable by the one or more processors to compute cosine similarity between two entities with compressed feature vectors in the compressed entity information based on the compressed feature vectors.

3. The system as recited in claim 1, wherein the program instructions are further executable by the one or more processors to add compressed feature vectors to the compressed entity information without requiring the feature vectors to be added to original uncompressed entity information and recompressing the entity information.

4. The system as recited in claim 1, wherein the program instructions are further executable by the one or more processors to subtract compressed feature vectors from the compressed entity information without requiring the feature vectors to be subtracted from original uncompressed entity information and recompressing the entity information.

5. The system as recited in claim 1, wherein the program instructions are further executable by at least one of the one or more processors to:
determine, based on the compressed entity information, that two entities with compressed feature vectors in the compressed entity information are to be merged; and
merge the two entities in the compressed entity information without requiring the compressed entity information to be decompressed.

6. The system as recited in claim 5, wherein, to merge the two entities, the program instructions are further executable by the one or more processors to add the compressed feature vectors of the two entities without requiring the compressed entity information to be decompressed.

7. The system as recited in claim 1, wherein the program instructions are further executable by at least one of the one or more processors to:
determine, based on the compressed entity information that an entity with compressed feature vectors in the compressed entity information is to be split to form two different entities; and
split the entity in the compressed entity information to form the two different entities in the compressed entity information without requiring the compressed entity information to be decompressed.

8. The system as recited in claim 7, wherein, to split the entity, the program instructions are further executable by the one or more processors to subtract one or more compressed feature vectors from the entity without requiring the compressed entity information to be decompressed.

9. A method, comprising:
performing, by a computer system comprising one or more processors:
compressing feature vectors representing mentions associated with a plurality of entities according to a locality sensitive hash (LSH) function H that, for a feature vector a, stores a dot product $a \cdot h_i$ as the hash of a such that H(a) is an array of dot products of length n; and
adding the compressed feature vectors to compressed entity information for the plurality of entities on one or more storage devices without decompressing the entity information.

10. The method as recited in claim 9, further comprising computing cosine similarity between two entities with compressed feature vectors in the compressed entity information based on the compressed feature vectors without decompressing the entity information.

11. The method as recited in claim 9, further comprising subtracting a compressed feature vector from the compressed entity information without decompressing the entity information.

12. The method as recited in claim 9, further comprising:
determining, based on the compressed entity information, that two entities with compressed feature vectors in the compressed entity information are to be merged; and
merging the two entities in the compressed entity information without requiring the compressed entity information to be decompressed.

13. The method as recited in claim 12, wherein merging the two entities comprises adding the compressed feature vectors of the two entities without requiring the compressed entity information to be decompressed.

14. The method as recited in claim 9, further comprising:
determining that an entity with compressed feature vectors in the compressed entity information is to be split to form two different entities; and
splitting the entity in the compressed entity information to form the two different entities in the compressed entity information without requiring the compressed entity information to be decompressed.

15. The method as recited in claim 14, wherein splitting the entity comprises subtracting one or more compressed feature vectors from the entity without requiring the compressed entity information to be decompressed.

16. One or more non-transitory, computer-readable storage media storing program instructions that when executed on or across one or more processors cause the one or more processors to:
compress feature vectors representing mentions associated with entities according to a locality sensitive hash (LSH) function H that, for a feature vector a, stores a dot product $a \cdot h_i$ as the hash of a such that H(a) is an array of dot products of length n; and
store the compressed feature vectors as compressed entity information for a plurality of entities on one or more storage devices.

17. The one or more non-transitory, computer-readable storage media of claim 16, further storing program instructions that when executed on or across one or more processors further cause the one or more processors to compute cosine similarity between two entities with compressed feature vectors in the compressed entity information based on the compressed feature vectors.

18. The one or more non-transitory, computer-readable storage media of claim 16, further storing program instructions that when executed on or across one or more processors further cause the one or more processors to add a compressed feature vector to the compressed entity information without requiring the feature vector to be added to original uncompressed entity information and recompressing the entity information.

19. The one or more non-transitory, computer-readable storage media of claim 16, further storing program instructions that when executed on or across one or more processors further cause the one or more processors to subtract a compressed feature vector from the compressed entity information without requiring the feature vector to be subtracted from original uncompressed entity information and recompressing the entity information.

20. The one or more non-transitory, computer-readable storage media of claim 16, further storing program instructions that when executed on or across one or more processors further cause the one or more processors to:
determine, based on the compressed entity information, that two entities with compressed feature vectors in the compressed entity information are to be merged; and
merge the two entities in the compressed entity information without requiring the compressed entity information to be decompressed;
wherein, to merge the two entities, the program instructions when executed further cause the one or more computers to add the compressed feature vectors of the two entities without requiring the compressed entity information to be decompressed.

* * * * *

UNITED STATES PATENT AND TRADEMARK OFFICE
CERTIFICATE OF CORRECTION

PATENT NO. : 11,017,151 B2
APPLICATION NO. : 16/833276
DATED : May 25, 2021
INVENTOR(S) : Wick et al.

It is certified that error appears in the above-identified patent and that said Letters Patent is hereby corrected as shown below:

On the Title Page

On page 2, Column 2, item (56) under Other Publications, Line 17, delete "proceesings" and insert -- proceedings --, therefor.

On page 2, Column 2, item (56) under Other Publications, Line 18, delete "Meting" and insert -- Meeting --, therefor.

In the Drawings

On sheet 3 of 13, in FIG. 3, under Reference Numeral 300, Line 2, delete "model ." and insert -- model. --, therefor.

In the Specification

In Column 4, Line 45, delete "linguistics," and insert -- Linguistics, --, therefor.

In Column 5, Line 64, delete "$E[\pi(1-\overline{X}_n)]=0,$" and insert -- $E[\pi(1-\overline{X}_n)] = \theta,$ --, therefor.

In Column 7, Line 19, delete "G" and insert -- $C_n$ --, therefor.

In Column 7, Line 28, delete "$E[C_n]-\cos(\theta)|<10^{-4},$" and insert -- $|E[C_n]-\cos(\theta)|<10^{-4},$ --, therefor.

In Column 7, Line 30, delete "$P(|_n-\cos(\theta)|\geq 0.1+10^{-4})\leq 0.124.$" and insert -- $P(|C_n-\cos(\theta)|\geq .1+10^{-4})\leq .124.$ --, therefor.

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*

In Column 10, Line 32, delete "$(a+b)\cdot h_i = a - h_i + b \cdot h_i$" and insert -- $(a+b)\cdot h_i = a\cdot h_i + b\cdot h_i$ --, therefor.

In Column 15, Line 47, delete "$\text{sign}(\Sigma_{i=1}^{d} h(i) \times a_1)$" and insert -- $\text{sign}(\Sigma_{i=1}^{d} h(i) \times a_i)$ --, therefor.

In Column 16, Line 60, after "any" insert -- $a_i$, --.